United States Patent
Kim et al.

(10) Patent No.: US 12,072,742 B2
(45) Date of Patent: Aug. 27, 2024

(54) ELECTRONIC DEVICE INCLUDING SEALING MEMBER

(71) Applicant: Samsung Electronics Co., Ltd., Gyeonggi-do (KR)

(72) Inventors: Jongkeun Kim, Gyeonggi-do (KR); Sunggun Cho, Gyeonggi-do (KR); Wonhee Choi, Gyeonggi-do (KR); Jaehee Kim, Gyeonggi-do (KR); Hwamok Pak, Gyeonggi-do (KR); Minyee An, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 115 days.

(21) Appl. No.: 17/571,672

(22) Filed: Jan. 10, 2022

(65) Prior Publication Data

US 2022/0236774 A1 Jul. 28, 2022

Related U.S. Application Data

(63) Continuation of application No. PCT/KR2022/000290, filed on Jan. 7, 2022.

(30) Foreign Application Priority Data

Jan. 27, 2021 (KR) .................... 10-2021-0011415

(51) Int. Cl.
*G06F 1/16* (2006.01)
*H05K 5/02* (2006.01)
(Continued)

(52) U.S. Cl.
CPC .......... *G06F 1/1681* (2013.01); *G06F 1/1618* (2013.01); *G06F 1/1652* (2013.01);
(Continued)

(58) Field of Classification Search
CPC .... G06F 1/1681; G06F 1/1618; G06F 1/1652; G06F 1/16; G06F 1/1616; G06F 1/1656;
(Continued)

(56) References Cited

U.S. PATENT DOCUMENTS

| | | | |
|---|---|---|---|
| 8,243,424 B1* | 8/2012 | Babu ..................... | G06F 1/1601 361/679.01 |
| 8,947,866 B2* | 2/2015 | Jacobs ................... | H10K 50/84 361/679.21 |

(Continued)

FOREIGN PATENT DOCUMENTS

| | | |
|---|---|---|
| JP | 2006-33203 A | 2/2006 |
| JP | 2014-64276 A | 4/2014 |

(Continued)

OTHER PUBLICATIONS

Japanese Office Action dated Apr. 18, 2023.
(Continued)

*Primary Examiner* — Anthony M Haughton
*Assistant Examiner* — Theron S Milliser
(74) *Attorney, Agent, or Firm* — Cha & Reiter, LLC

(57) ABSTRACT

An electronic device is disclosed, including a hinge connecting to first and second housings as to enable foldability, a flexible display spanning at least a portion of the first housing and the second housing, wherein the flexible display is foldable and unfoldable along with folding and unfolding of the first and second housings, a first sealing member extending as to be disposed between an inner surface of the first housing, an inner surface of the second housing, and an outer surface of the flexible display and an elastic support member disposed between a portion of the flexible display, a portion of the inner surface of the first housing, and a portion of the inner surface of the second housing, within a
(Continued)

folding area in which the first housing and the second housing are foldable and unfoldable.

20 Claims, 40 Drawing Sheets

(51) Int. Cl.
  *H05K 5/03* (2006.01)
  *H05K 7/14* (2006.01)
(52) U.S. Cl.
  CPC .............. *H05K 5/0226* (2013.01); *H05K 5/03* (2013.01); *H05K 7/1417* (2013.01)
(58) Field of Classification Search
  CPC ...... H05K 5/0226; H05K 5/03; H05K 7/1417; H05K 5/06; H05K 5/061; F16C 11/04; H04M 1/02; H04M 1/0216; H04M 1/0268
  See application file for complete search history.

(56) References Cited

U.S. PATENT DOCUMENTS

| | | | |
|---|---|---|---|
| 9,066,430 B2 * | 6/2015 | Park ...................... | H05K 5/061 |
| 9,201,459 B2 * | 12/2015 | Lee ....................... | G06F 1/1637 |
| 9,229,481 B2 * | 1/2016 | Jinbo ..................... | G09F 9/301 |
| 9,460,643 B2 * | 10/2016 | Hirakata ............... | G06F 1/1616 |
| 9,465,458 B1 * | 10/2016 | Babu ...................... | G06F 1/1601 |
| 9,719,665 B2 * | 8/2017 | Hirakata ............... | H04W 72/23 |
| 9,952,626 B2 * | 4/2018 | Jinbo ..................... | G06F 1/1677 |
| 10,104,790 B2 * | 10/2018 | Lee ..................... | E05D 11/0054 |
| 10,119,683 B2 * | 11/2018 | Hirakata ............... | H04W 72/23 |
| 10,125,955 B2 * | 11/2018 | Hirakata ............... | H04W 72/23 |
| 10,271,438 B2 * | 4/2019 | Hirakata ............ | H10K 59/1213 |
| 10,306,788 B2 * | 5/2019 | Bi ........................ | H04M 1/0214 |
| 10,711,980 B2 * | 7/2020 | Hirakata ............... | F21V 15/012 |
| 10,726,748 B2 * | 7/2020 | Ochi ...................... | H10K 50/11 |
| 10,838,458 B1 * | 11/2020 | Park ...................... | H04M 1/185 |
| 10,912,205 B2 * | 2/2021 | Hirakata ............... | H05K 5/0017 |
| 10,917,978 B2 * | 2/2021 | Hirakata ............ | H10K 59/1213 |
| 11,054,869 B2 * | 7/2021 | Moon ................. | H04M 1/0268 |
| 11,119,534 B2 * | 9/2021 | Lee ....................... | G06F 1/1616 |
| 11,143,387 B2 * | 10/2021 | Hirakata ............... | F21V 15/012 |
| 11,153,980 B2 * | 10/2021 | Hirakata ............... | H10K 50/84 |
| 11,270,605 B2 * | 3/2022 | Ochi ..................... | G09F 9/301 |
| 11,304,318 B2 * | 4/2022 | Hirakata ............ | H10K 59/1213 |
| 11,309,521 B2 * | 4/2022 | Yuan .................... | H10K 50/841 |
| 11,371,678 B2 * | 6/2022 | Hirakata ............... | H04W 72/569 |
| 11,395,415 B2 * | 7/2022 | Gu ........................ | G06F 1/1601 |
| 11,507,137 B2 * | 11/2022 | Park ...................... | H04M 1/185 |
| 11,516,927 B2 * | 11/2022 | Hirakata ................ | G09F 9/301 |
| 11,602,058 B2 * | 3/2023 | Kim ..................... | G06F 1/1652 |
| 11,625,074 B2 * | 4/2023 | Moon .................... | H04M 1/022 |
| | | | 361/679.27 |
| 11,639,785 B2 * | 5/2023 | Hirakata ............... | H04W 72/23 |
| | | | 370/329 |
| 2009/0250261 A1 | 10/2009 | Hayashi et al. | |
| 2013/0342971 A1 * | 12/2013 | Jacobs .................. | H10K 50/84 |
| | | | 361/679.01 |
| 2014/0087792 A1 * | 3/2014 | Park ...................... | H05K 5/061 |
| | | | 455/575.1 |
| 2014/0177154 A1 * | 6/2014 | Lee ...................... | G06F 1/1656 |
| | | | 361/679.26 |
| 2015/0016126 A1 * | 1/2015 | Hirakata ............... | H04W 72/23 |
| | | | 362/418 |
| 2015/0062927 A1 * | 3/2015 | Hirakata ............. | H01F 1/14708 |
| | | | 362/362 |
| 2015/0177789 A1 * | 6/2015 | Jinbo ................... | H10K 50/841 |
| | | | 313/511 |
| 2016/0116944 A1 | 4/2016 | Lee et al. | |
| 2016/0187930 A1 * | 6/2016 | Jinbo .................... | G06F 1/1652 |
| | | | 313/511 |
| 2017/0006716 A1 * | 1/2017 | Hirakata ............... | H05K 5/0086 |
| 2017/0099742 A1 | 4/2017 | Choi et al. | |
| 2017/0268750 A1 * | 9/2017 | Hirakata ............... | F21V 15/012 |
| 2017/0364123 A1 | 12/2017 | Seo | |
| 2017/0374749 A1 * | 12/2017 | Lee ...................... | G06F 1/1616 |
| 2018/0150102 A1 * | 5/2018 | Lee ...................... | G06F 1/1652 |
| 2018/0231216 A1 * | 8/2018 | Hirakata ............... | F21V 15/012 |
| 2018/0317333 A1 * | 11/2018 | Bi ......................... | H05K 5/0017 |
| 2019/0006444 A1 | 1/2019 | Nishimura | |
| 2019/0028579 A1 | 1/2019 | Cho et al. | |
| 2019/0086059 A1 * | 3/2019 | Hirakata ............... | F21V 15/012 |
| 2019/0189035 A1 * | 6/2019 | Ochi ...................... | H10K 59/10 |
| 2019/0223301 A1 * | 7/2019 | Hirakata ............... | H10K 50/84 |
| 2020/0052246 A1 * | 2/2020 | Yuan .................. | H10K 50/8426 |
| 2020/0100372 A1 * | 3/2020 | Hirakata ............. | H05K 5/0017 |
| 2020/0109838 A1 * | 4/2020 | Hirakata ............... | H04W 72/23 |
| 2020/0137911 A1 | 4/2020 | Kim et al. | |
| 2020/0162596 A1 | 5/2020 | Kim et al. | |
| 2020/0264673 A1 | 8/2020 | Kim et al. | |
| 2020/0302834 A1 * | 9/2020 | Ochi ........................ | G09F 9/301 |
| 2020/0352038 A1 * | 11/2020 | Kim ...................... | H04M 1/185 |
| 2020/0382627 A1 | 12/2020 | Park et al. | |
| 2021/0004049 A1 * | 1/2021 | Park ...................... | G06F 1/1681 |
| 2021/0007229 A1 * | 1/2021 | Gu ........................ | G06F 1/1601 |
| 2021/0048703 A1 | 2/2021 | Fujita | |
| 2021/0076512 A1 * | 3/2021 | Hirakata ............... | H05K 5/0086 |
| 2021/0116975 A1 * | 4/2021 | Moon ................. | H04M 1/0268 |
| 2021/0247054 A1 * | 8/2021 | Hirakata ............... | H04W 72/23 |
| 2021/0294390 A1 * | 9/2021 | Moon .................... | G06F 1/1681 |
| 2021/0345500 A1 * | 11/2021 | Hirakata ............... | H05K 5/0017 |
| 2022/0132683 A1 * | 4/2022 | Hirakata ............... | H01F 1/14791 |
| 2022/0287077 A1 * | 9/2022 | Hirakata ............... | F21V 15/012 |
| 2023/0034972 A1 * | 2/2023 | Hirakata ................ | G09F 9/301 |
| 2023/0044853 A1 * | 2/2023 | Park ...................... | H04M 1/0216 |
| 2023/0209733 A1 * | 6/2023 | Kim ...................... | G06F 1/1647 |
| | | | 361/809 |

FOREIGN PATENT DOCUMENTS

| | | |
|---|---|---|
| JP | 2017-510065 A | 4/2017 |
| JP | 2019-133051 A | 8/2019 |
| KR | 10-1663517 B1 | 10/2016 |
| KR | 10-2017-0040082 A | 4/2017 |
| KR | 10-2019-0001864 A | 1/2019 |
| KR | 10-2020-0046628 A | 5/2020 |
| KR | 10-2020-0057236 A | 5/2020 |
| KR | 10-2020-0101241 A | 8/2020 |
| KR | 10-2165647 B1 | 10/2020 |
| KR | 10-2020-0137948 A | 12/2020 |
| KR | 10-2309411 B1 | 10/2021 |
| KR | 10-2434866 B1 | 8/2022 |
| WO | 2016/017075 A1 | 2/2016 |

OTHER PUBLICATIONS

International Search Report dated Apr. 15, 2022.
Written Opinion dated Apr. 15, 2022.
European Search Report dated Feb. 26, 2024.

* cited by examiner

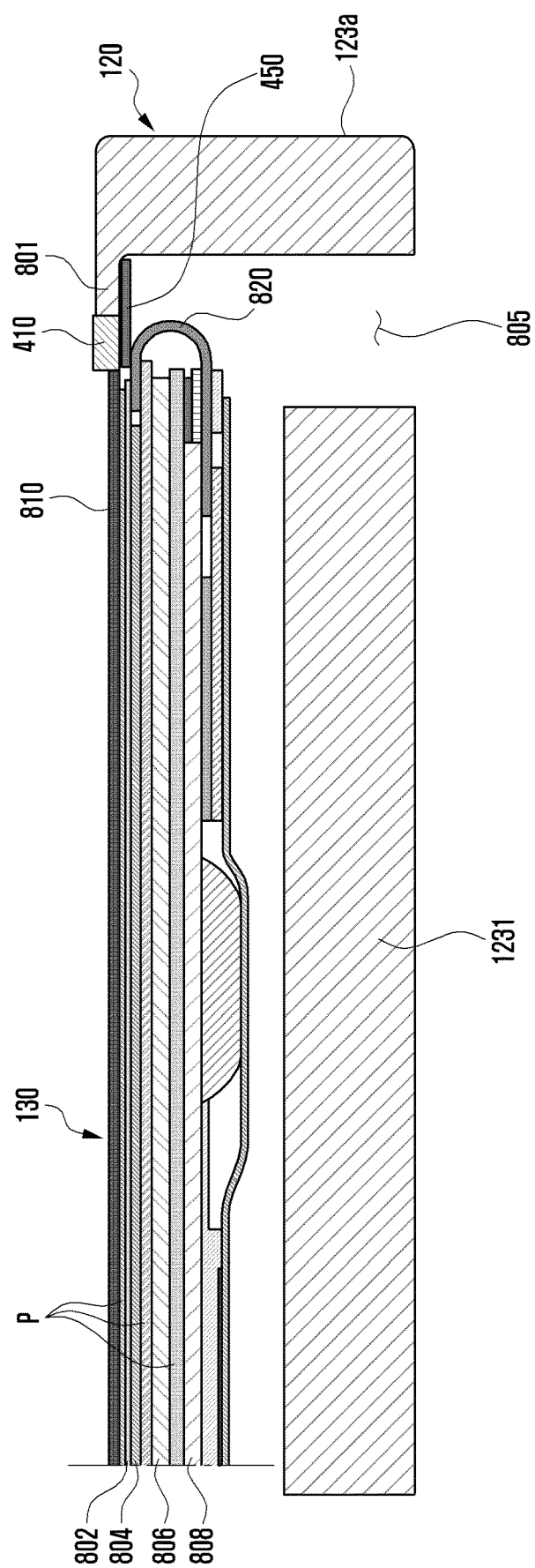

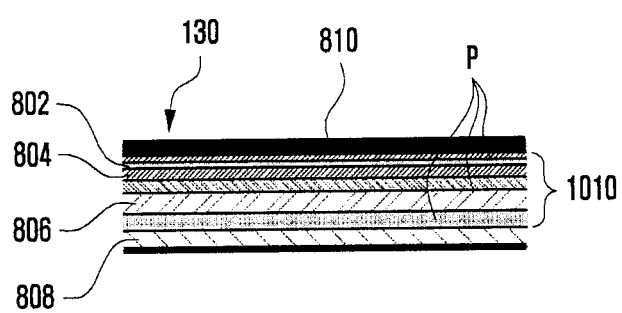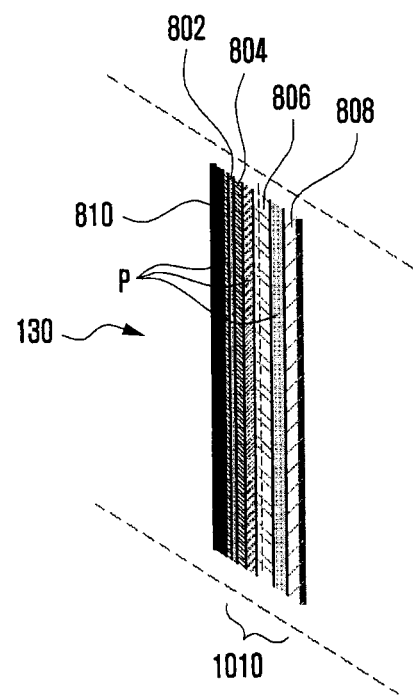
FIG. 10A
FIG. 10B

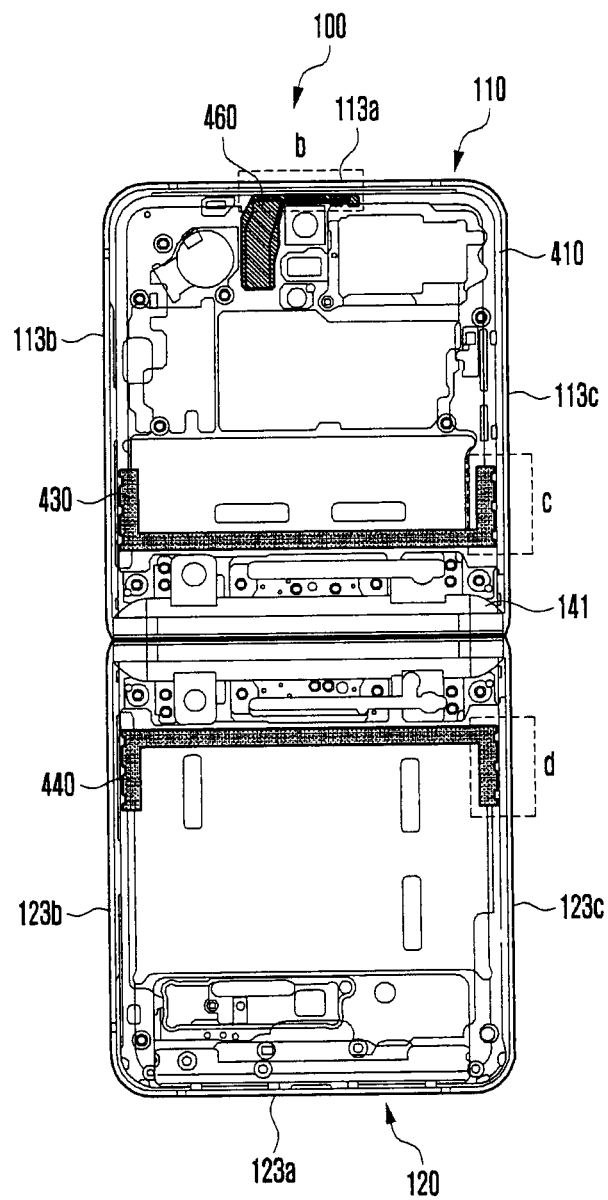
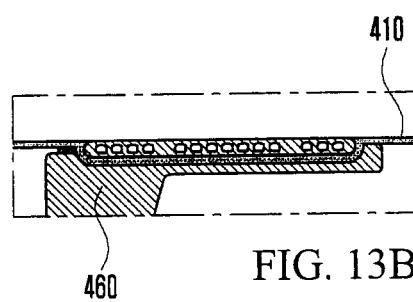
FIG. 13B
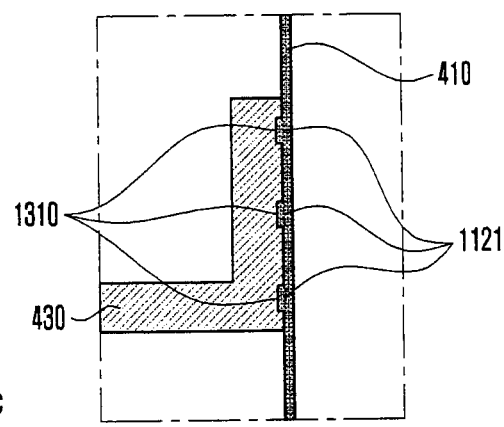
FIG. 13C
FIG. 13A

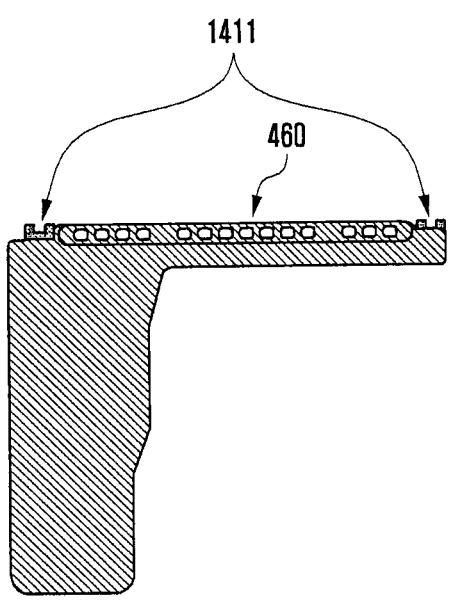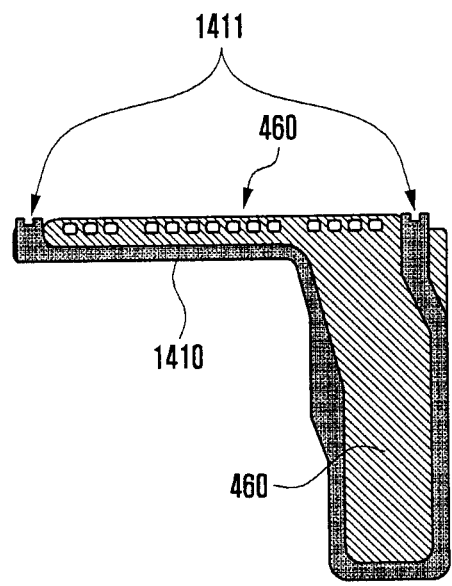
FIG. 14A                    FIG. 14B

ELECTRONIC DEVICE INCLUDING SEALING MEMBER

CROSS-REFERENCE TO RELATED APPLICATION(S)

This application is a Continuation of and based on and claims priority under 35 U.S.C. § 120 to PCT International Application No. PCT/KR2022/000290, which was filed on Jan. 7, 2022, and claims priority to Korean Patent Application No. 10-2021-0011415, filed on Jan. 27, 2021, in the Korean Intellectual Property Office, the disclosures of which are incorporated by reference herein their entirety.

TECHNICAL FIELD

Certain embodiments of the disclosure relate to an electronic device including at least one sealing member, and more particularly, to a foldable electronic device having a seal protecting against intrusion by foreign contaminants.

BACKGROUND

The use of foldable electronic devices such as foldable smartphones and tablet-style personal computers (PCs) is increasing.

A foldable electronic device may have a variable physical configuration, in which a first housing and a second housing may be folded or unfolded around a hinge module.

For example, a foldable electronic device may be configured to be in an in-folding and/or an out-folding configuration, as set via rotations of the first housing and the second housing about the hinge module.

A foldable electronic device may include a flexible display disposed at least partially across a first housing, a hinge module, and a second housing.

In the foldable electronic device, when the first housing and the second housing are folded using the hinge module, the flexible display may be folded, and when the first housing and the second housing are unfolded, the flexible display may be unfolded.

A plurality of electronic components may be disposed on a printed circuit board disposed in an internal space of the foldable electronic device. In the foldable electronic device, the operation of the electronic components may be affected by the foldable configuration. Furthermore, allowing foldability often creates gaps and seams in the external housing, and accordingly, the foldable device is at risk to damage and internal contamination incident from invasive moisture and/or foreign substances introduced into the interior of the device from an external environment.

Accordingly the foldable electronic device may be particularly weak with regards to waterproofing and/or dustproofing in specific portions of the first housing and the second housing near to the hinge module, where such gaps and openings often occur.

SUMMARY

Certain embodiments of the disclosure may provide a foldable electronic device including waterproofing and/or dustproofing using at least one sealing member irrespective of the foldable configuration.

According to certain embodiments of the disclosure, an electronic device includes a hinge module, a first housing to which a first side of the hinge module and at least a portion of a first support plate are coupled, the first housing including a first side surface, a second side surface, and a third side surface, a second housing to which a second side of the hinge module and at least a portion of the second support plate are coupled, the second housing including a fourth side surface, a fifth side surface, and a sixth side surface, wherein the second housing is foldable and unfoldable with the first housing about a folding axis defined by the hinge module, a flexible display spanning at least a portion of the first housing and the second housing, wherein the flexible display is foldable and unfoldable along with folding and unfolding of the first and second housings, a first sealing member extending as to be disposed between an inner surface of the first housing, an inner surface of the second housing, and an outer surface of the flexible display, and an elastic support member disposed between a portion of the flexible display, a portion of the inner surface of the first housing, and a portion of the inner surface of the second housing, within a folding area in which the first housing and the second housing are foldable and unfoldable.

According to certain embodiments of the disclosure, an electronic device includes a hinge module, a first housing to which a first side of the hinge module and at least a portion of a first support plate are coupled, the first housing including a first side surface, a second side surface, and a third side surface, a second housing to which a second side of the hinge module and at least a portion of a second support plate are coupled, the second housing including a fourth side surface, a fifth side surface, and a sixth side surface, wherein the second housing is foldable and unfoldable with the first housing about a folding axis defined by the hinge module, a flexible display spanning at least a portion of the first housing and the second housing, wherein the flexible display is foldable and unfoldable along with folding and unfolding of the first and second housings, and a first sealing member extending as to be disposed between an inner surface of the first housing, an inner surface of the second housing, and an outer surface of the flexible display Certain embodiments of the disclosure provide an electronic device in which a sealing member (e.g., adhesive member) integrally extends between an outer surface of a flexible display and an inner surface of housings (e.g., first housing and second housing), which may thus provide waterproofing and/or dustproofing, protecting the foldable device against intrusion by moisture and/or foreign substances.

Certain embodiments of the disclosure provide an electronic device including an elastic support member that is disposed between a sealing member positioned adjacent to a folding area of the two housings and an inner surface of the two housings, which thus prevents the sealing member from being ejected out of the housing in certain physical configurations of the electronic device.

Further, various effects recognized directly or indirectly through certain embodiments of the disclosure can be provided.

DESCRIPTION OF DRAWINGS

In connection with the description of the drawings, the same or similar reference numerals may be used for the same or similar components.

FIGS. 8A to 8E are cross-sectional views illustrating an embodiment of a portion e-e' of the electronic device illustrated in FIG. 4A according to certain embodiments of the disclosure.

FIG. 10A is a diagram schematically illustrating a portion of a flexible display in an unfolded state according to certain embodiments of the disclosure.

FIG. 10B is a diagram schematically illustrating a portion of a flexible display in a folded state according to certain embodiments of the disclosure.

FIG. 13A is a plan view schematically illustrating the inside of an electronic device before a flexible display is mounted in the electronic device according to certain embodiments of the disclosure.

FIG. 13B is an enlarged view illustrating an embodiment of a portion b illustrated in FIG. 13A according to certain embodiments of the disclosure.

FIG. 13C is an enlarged view illustrating a portion c illustrated in FIG. 13A according to certain embodiments of the disclosure.

FIG. 14A is a diagram illustrating a front surface of a receiver plate according to certain embodiments of the disclosure.

FIG. 14B is a diagram illustrating a rear surface of a receiver plate according to certain embodiments of the disclosure.

DETAILED DESCRIPTION

Figure 1A:
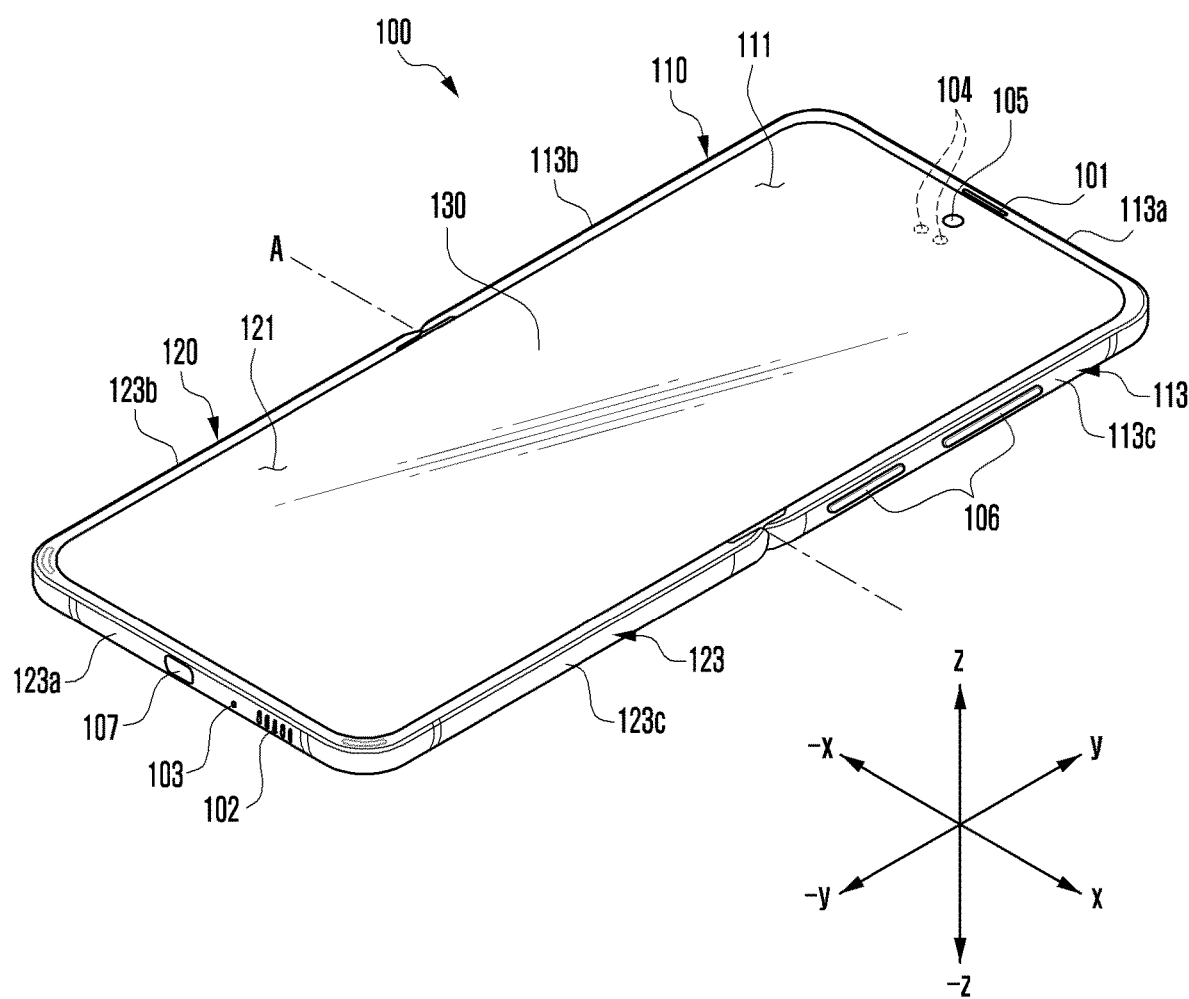
FIG. 1A is a perspective view illustrating a front surface of an electronic device in an unfolded state according to certain embodiments of the disclosure.

Certain embodiments of this document and terms used therein are not intended to limit technical features described in this document to specific embodiments, and should be understood to include various modifications, equivalents, or substitutions of the embodiments.

In connection with the description of the drawings, like reference numerals may be used for similar or related components. A singular form of a noun corresponding to an item may include one or more of the item, unless the relevant context clearly dictates otherwise. In this document, each of phrases such as "A or B", "at least one of A and B", "at least one of A or B", "A, B or C", "at least one of A, B and C", and "at least one of" "A, B, or C" may include any one of items listed together in the corresponding one of the phrases, or all possible combinations thereof. Terms such as "first" or "second" may simply be used for distinguishing an element from other elements, and do not limit elements in other aspects (e.g., importance or order).

A module used in this document may be an integrally formed component or a minimum unit or a portion of the component that performs one or more functions.

Figure 1B:
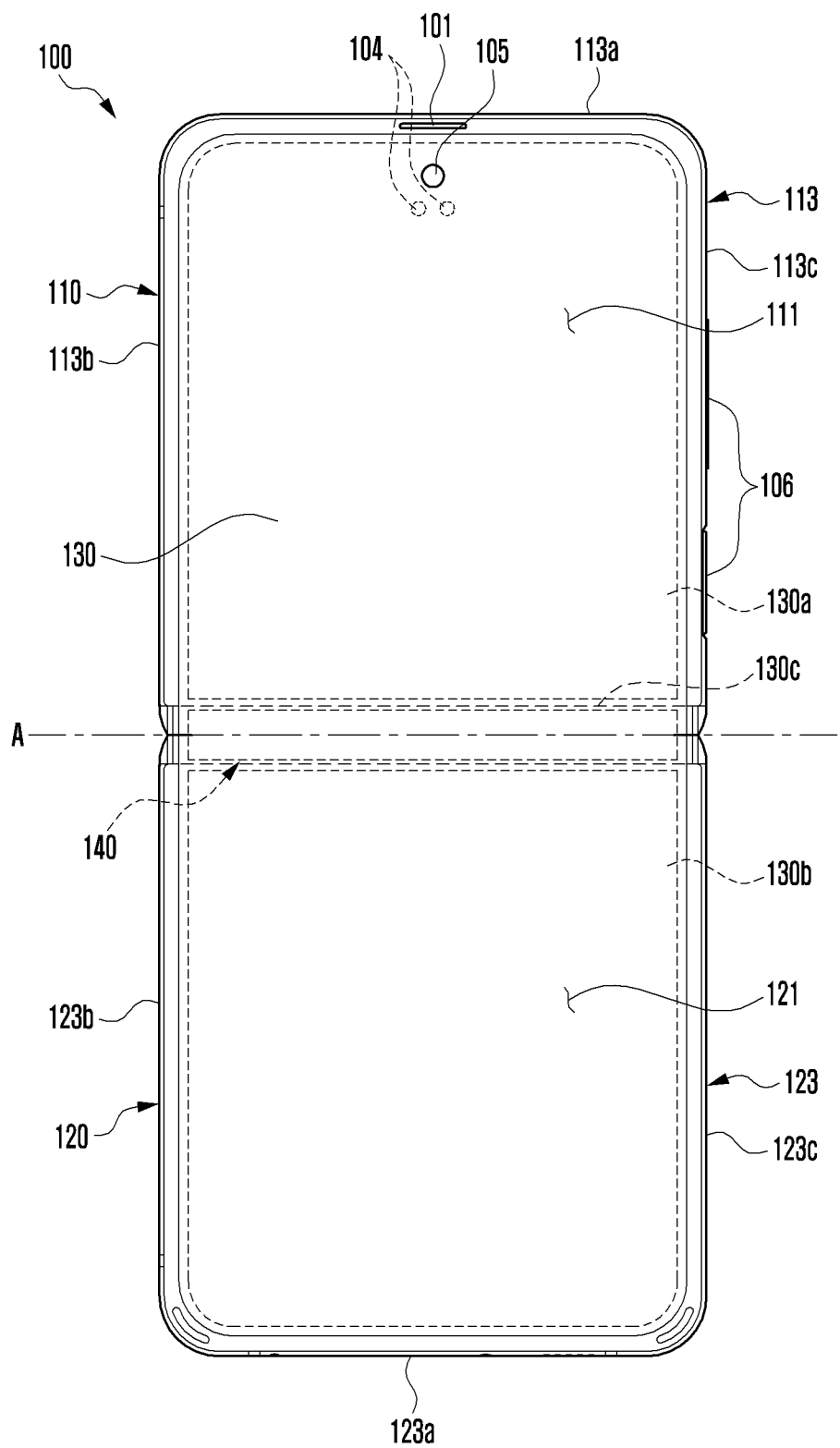
FIG. 1B is a plan view illustrating a front surface of an electronic device in an unfolded state according to certain embodiments of the disclosure.
Figure 1C:
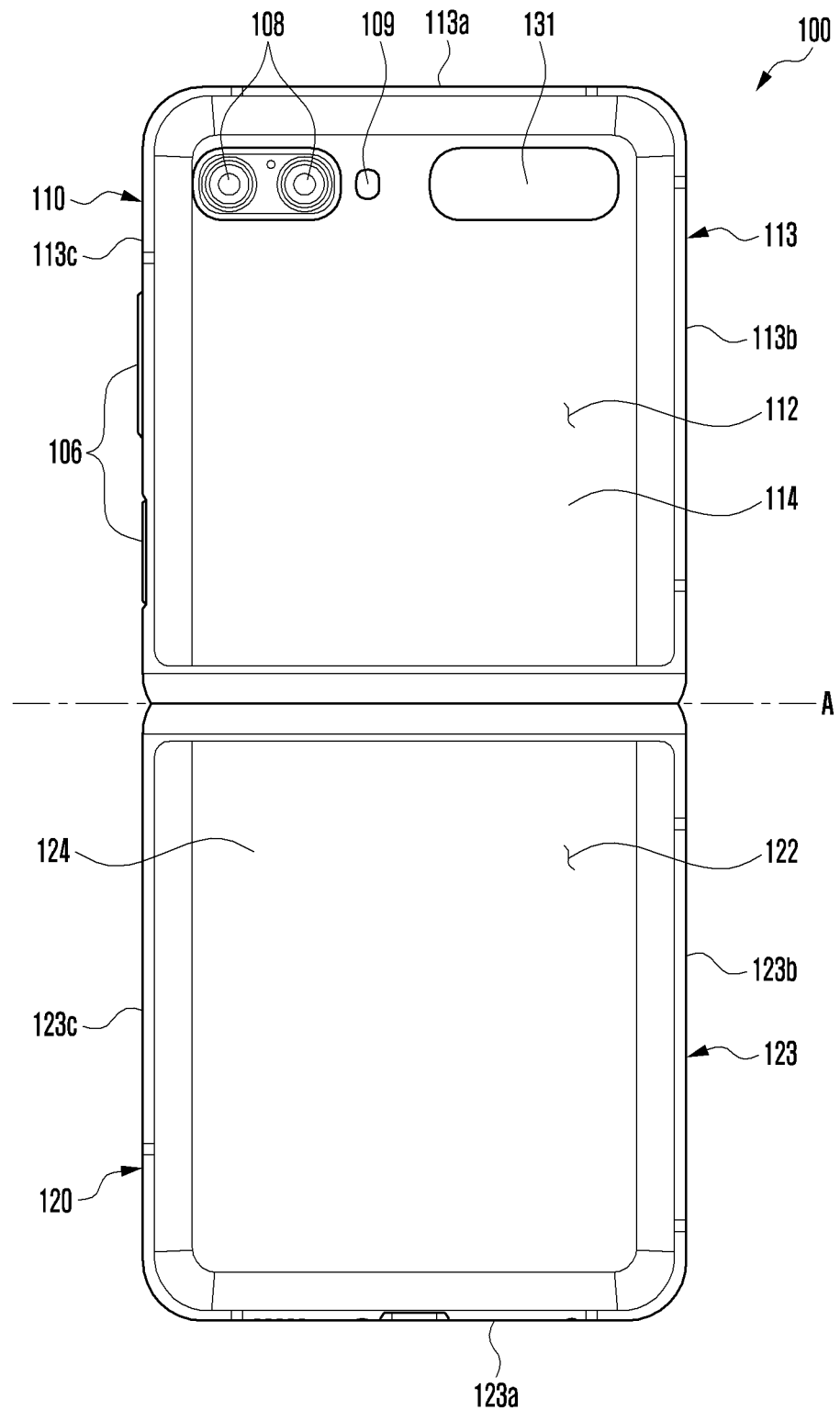
FIG. 1C is a plan view illustrating a rear surface of an electronic device in an unfolded state according to certain embodiments of the disclosure.

FIG. 1A is a perspective view illustrating a front surface of an electronic device in an unfolded state according to certain embodiments of the disclosure. FIG. 1B is a plan view illustrating a front surface of an electronic device in an unfolded state according to certain embodiments of the disclosure. FIG. 1C is a plan view illustrating a rear surface of an electronic device in an unfolded state according to certain embodiments of the disclosure.

Figure 2A:
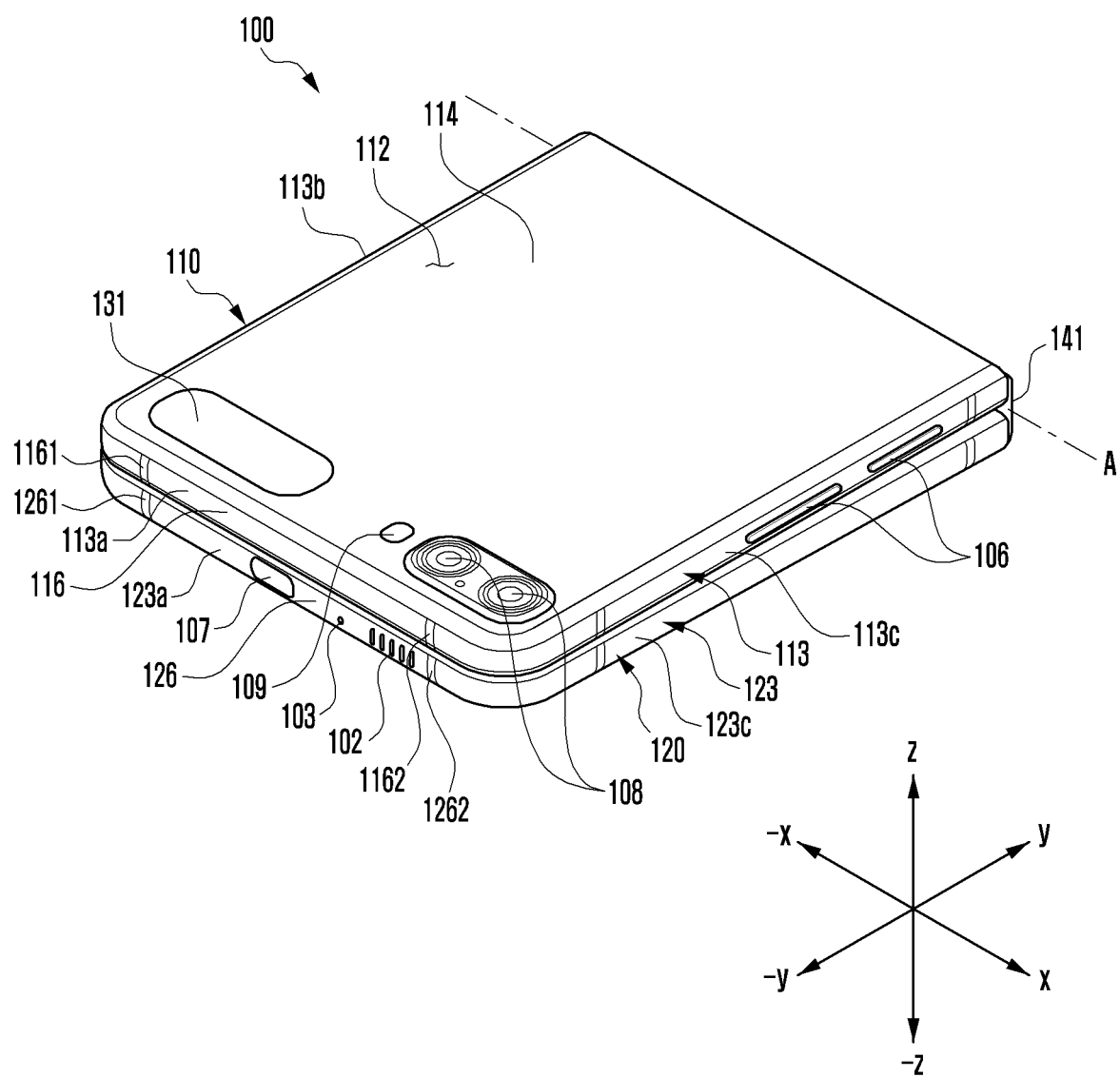
FIG. 2A is a perspective view illustrating an unfolded state of an electronic device according to certain embodiments of the disclosure.
Figure 2B:
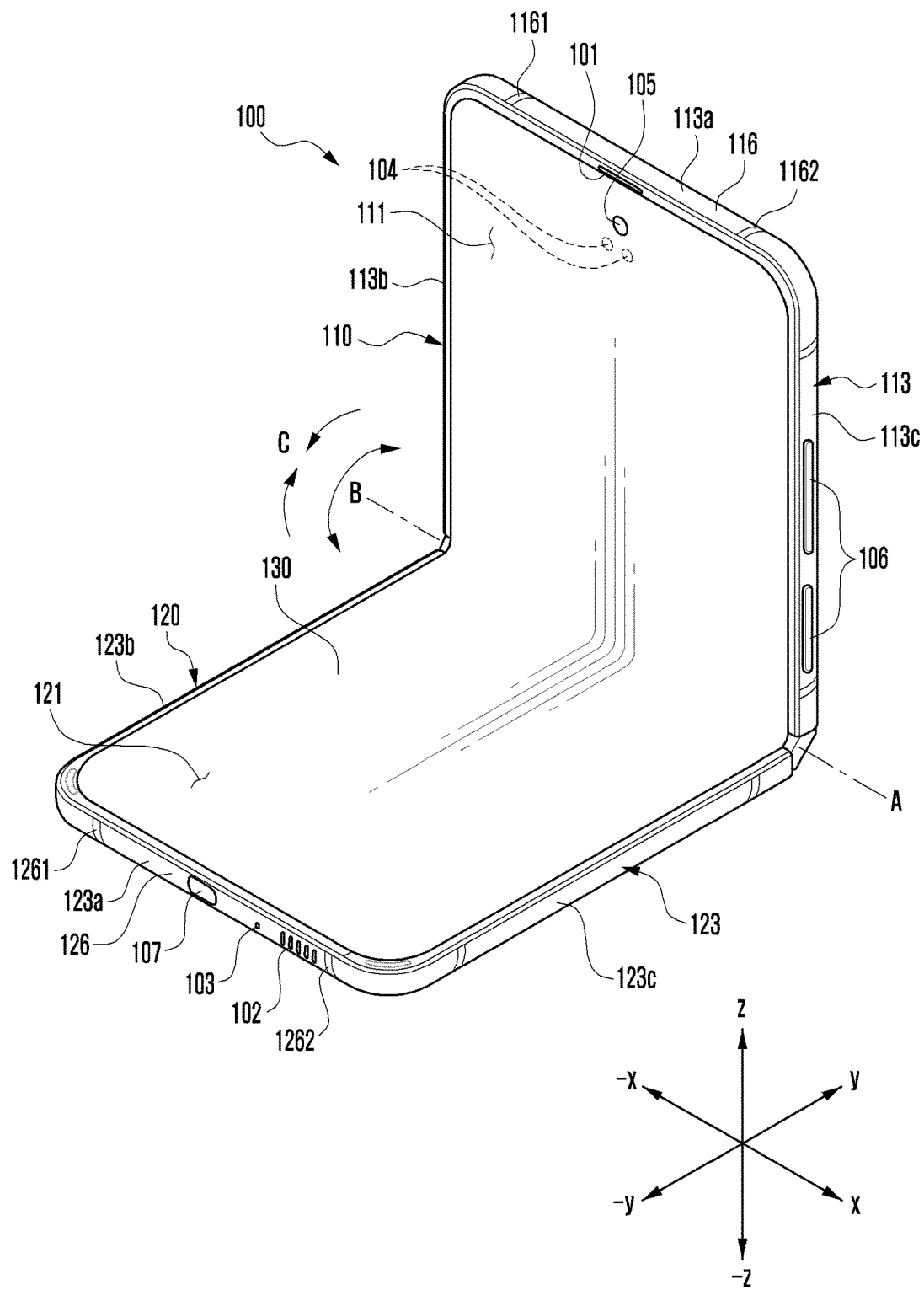
FIG. 2B is a perspective view illustrating a front surface of an electronic device in an intermediate state according to certain embodiments of the disclosure.

FIG. 2A is a perspective view illustrating an unfolded state of an electronic device according to certain embodiments of the disclosure. FIG. 2B is a perspective view illustrating a front surface of an electronic device in an intermediate state according to certain embodiments of the disclosure.

An electronic device 100 illustrated in FIGS. 1A to 2B may include, for example, a foldable electronic device folded or unfolded in a vertical direction. Although certain embodiments of the disclosure have been described with respect to a foldable electronic device folded or unfolded in a vertical direction, the same may be applied to a foldable electronic device folded or unfolded in a horizontal direction.

Figure 3:
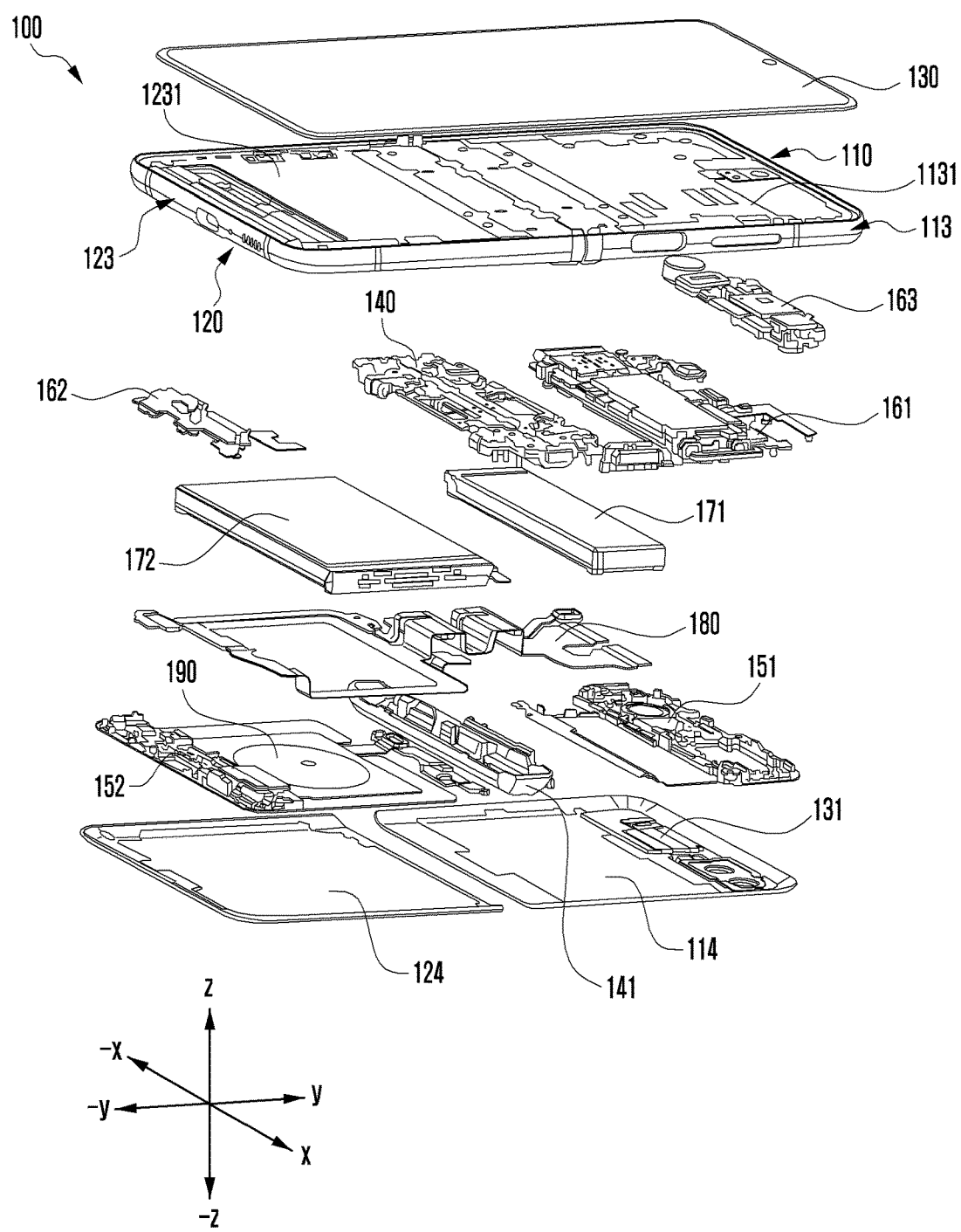
FIG. 3 is an exploded perspective view illustrating an electronic device according to certain embodiments of the disclosure.

With reference to FIGS. 1A to 2B, an electronic device 100 according to certain embodiments of the disclosure may include a pair of housings (e.g., a first housing 110 and a second housing 120) (e.g., foldable housing) that are foldable relative to one another via a hinge module (e.g., a hinge module 140 of FIG. 1B or FIG. 3). In some embodiments, the hinge module (e.g., the hinge module 140 of FIG. 1B or FIG. 3) may be disposed in an X-axis direction (e.g., horizontal direction) or a Y-axis direction (e.g., longitudinal direction). In some embodiments, two or more hinge modules (e.g., the hinge module 140 of FIG. 1B or FIG. 3) may be disposed to be folded in the same direction or in different directions.

According to certain embodiments, the electronic device 100 may include a flexible display 130 (e.g., foldable display) spanning at least a portion of a surface formed by the pair of housings 110 and 120. The first housing 110 and the second housing 120 may be disposed at both sides about a folding axis (axis A) and have a substantially symmetrical shape with respect to the folding axis (axis A). The first housing 110 and the second housing 120 may have different angles or distances from each other according to whether the electronic device 100 is in an unfolded or flat state, a folded state, or an intermediate state.

According to certain embodiments, the pair of housings 110 and 120 may include a first housing 110 (e.g., first housing structure) coupled to a first side of the hinge module (e.g., the hinge module 140 of FIG. 1B or FIG. 3) and a second housing 120 (e.g., second housing structure) coupled to a second side of the hinge module (e.g., the hinge module 140 of FIG. 1B or FIG. 3). In the unfolded state, the first housing 110 may include a first surface 111 facing in a first direction (e.g., a front (z-axis) direction) and a second surface 112 facing in a second direction (e.g., a rear (−z-axis) direction) opposite to the first direction. In the unfolded state, the second housing 120 may include a third surface 121 facing in a first direction (e.g., z-axis direction) and a fourth surface 122 facing in a second direction (e.g., −z-axis direction).

According to an embodiment, in the unfolded state of the electronic device 100, the first surface 111 of the first housing 110 and the third surface 121 of the second housing 120 may be configured as to face in substantially the same first direction (e.g., z-axis direction), and in the folded state, the first surface 111 and the third surface 121 may be configured so as to face each other. In the unfolded state of the electronic device 100, the second surface 112 of the first housing 110 and the fourth surface 122 of the second housing 120 may be configured so as to face in substantially the same second direction (e.g., −z-axis direction), and in the folded state, the second surface 112 and the fourth surface 122 may be configured so as to face in opposite directions. For example, in a folded state, in the first housing 110 and the second housing 120, the second surface 112 may face in the first direction (e.g., z-axis direction), and the fourth surface 122 may face in a second direction (e.g., −z-axis direction).

According to certain embodiments, the first housing 110 may include a first side frame 113 at least partially forming an external appearance of the electronic device 100, and a first rear cover 114 coupled to the first side frame 113 and forming at least a portion of the second surface 112 of the electronic device 100. The first side frame 113 may include a first side surface 113a, a second side surface 113b extending from one end of the first side surface 113a, and a third side surface 113c extending from the other end of the first side surface 113a. The first side frame 113 may be formed in a rectangular (e.g., square or rectangular) shape through the first side surface 113a, the second side surface 113b, and the third side surface 113c.

According to certain embodiments, the second housing 120 may include a second side frame 123 at least partially forming an external appearance of the electronic device 100, and a second rear cover 124 coupled to the second side frame 123 and forming at least a portion of the fourth surface 122 of the electronic device 100. The second side frame 123 may include a fourth side surface 123a, a fifth side surface 123b extending from one end of the fourth side surface 123a, and a sixth side surface 123c extending from the other end of the fourth side surface 123a. The second side frame 123 may be formed in a rectangular (e.g., square or rectangular) shape through the fourth side surface 123a, the fifth side surface 123b, and the sixth side surface 123c.

According to certain embodiments, the pair of housings 110 and 120 are not limited to the illustrated shape and coupling, and may be implemented by other combinations and/or couplings of other shapes or components. For example, the first side frame 113 may be integrally formed with the first rear cover 114, and the second side frame 123 may be integrally formed with the second rear cover 124.

According to certain embodiments, in the unfolded state of the electronic device 100, the second side surface 113b of the first side frame 113 and the fifth side surface 123b of the second side frame 123 may be connected without any gap. In the unfolded state of the electronic device 100, the third side surface 113c of the first side frame 113 and the sixth side surface 123c of the second side frame 123 may be connected without any gap. In the unfolded state, a combined length of the second side surface 113b and the fifth side surface 123b may be longer than a length of the first side surface 113a and/or the fourth side surface 123a. Likewise, a combined length of the third side surface 113c and the sixth side surface 123c may be longer than a length of the first side surface 113a and/or the fourth side surface 123a.

According to certain embodiments, the first side frame 113 and/or the second side frame 123 may be made of a metal, and/or may further include a polymer injected into the metal. The first side frame 113 and/or the second side frame 123 may include at least one conductive portion 116 and/or 126 electrically segmented through at least one segmented portion 1161, 1162, and/or 1261 and 1262, and be made of a polymer. In this case, the at least one conductive portion 116 and/or 126 may be electrically connected to a wireless communication circuit disposed on a printed circuit board (not illustrated) of the electronic device 100, thereby serving as an antenna operating in at least one specified band (e.g., legacy band).

According to certain embodiments, the first rear cover 114 and/or the second rear cover 124 may be formed by, for example, at least one of coated or colored glass, ceramic, polymer, or metal (e.g., aluminum, stainless steel (STS), or magnesium) or a combination of at least two thereof.

According to certain embodiments, the flexible display 130 may extend from the first surface 111 of the first housing 110 to at least a portion of the third surface 121 of the second housing 120 across the hinge module (e.g., the hinge module 140 of FIG. 1B). For example, the flexible display 130 may include a first flat area 130a substantially corresponding to the first surface 111, a second flat area 130b corresponding to the second surface 121, and a folding area 130c (e.g., bending region) connecting the first flat area 130a and the second flat area 130b, and corresponding positionally to the hinge module (e.g., the hinge module 140 of FIG. 1B or FIG. 3).

According to an embodiment, the flexible display 130 may include an unbreakable (UB) type OLED display (e.g., curved display). However, the flexible display 130 is not limited thereto, and may include a flat type display of an on cell touch active matrix organic light-emitting diode (OCTA) type.

According to certain embodiments, in the flexible display 130, an edge (e.g., outer surface) of the first flat area 130a may be disposed at an inner surface of the first housing 110. In the flexible display 130, an edge (e.g., outer surface) of the second flat area 130b may be disposed at an inner surface of the second housing 120. An edge of the flexible display 130 may be protected through a protective cap (not illustrated) disposed in an area corresponding to the hinge module (e.g., the hinge module 140 of FIG. 1B or FIG. 3). The protective cap (not illustrated) may be selectively used or omitted according to design specifications of the electronic device 100.

According to certain embodiments, the electronic device 100 may include a hinge housing 141 (e.g., hinge cover). The hinge housing 141 may support the hinge module (e.g., the hinge module 140 of FIG. 1B or FIG. 3), and may further be exposed to the exterior environment when the electronic device 100 is in a folded state. When the electronic device 100 is in an unfolded state, the hinge housing 141 may be stowed into the first space (e.g., the inner space of the first housing 110) and the second space (e.g., the inner space of the second housing 120), and thus is no longer visible from an exterior of the device. In some embodiments, the flexible display 130 may extend from at least a portion of the second surface 112 to at least a portion of the fourth surface 122. In this case, the electronic device 100 may be folded so that the flexible display 130 is visually exposed (e.g., out-folding) to the outside.

According to certain embodiments, the electronic device 100 may include a sub-display 131 disposed separately from the flexible display 130. The sub-display 131 may be disposed so as to be at least partially visible to an exterior within the second surface 112 of the first housing 110, so that when the electronic device 100 is in a folded state, the sub-display 131 may display state information of the flexible display 130. The sub-display 131 may be visible from the exterior through at least a partial area of the first rear cover 114. In some embodiments, the sub-display 131 may be disposed at the fourth surface 122 of the second housing 120. In this case, the sub-display 131 may be disposed to be visible from the exterior through at least a partial area of the second rear cover 124.

According to certain embodiments, the electronic device 100 may include at least one of an input device 103 (e.g., microphone), sound output devices 101 and 102, a sensor module 104, camera devices 105 and 108, a key input device 106, or a connector port 107. In the illustrated embodiment, the input device 103 (e.g., microphone), the sound output device 101 and 102, the sensor module 104, the camera devices 105 and 108, the key input device 106, or the connector port 107 may also refer to and/or include a hole or shape formed in the first housing 110 or the second housing 120, but otherwise may be defined to include a substantial electronic component (e.g., input device, sound output device, sensor module, or camera device) disposed inside the electronic device 100 and operating through the hole or shape.

According to certain embodiments, the input device 103 may include at least one microphone 103 disposed in the second housing 120. In some embodiments, the input device 103 may include a plurality of microphones 103 disposed to detect a direction of a sound. In some embodiments, the plurality of microphones 103 may be disposed at specified locations of the first housing 110 and/or the second housing 120. The sound output devices 101 and 102 may include speakers 101 and 102. The speakers 101 and 102 may include a receiver 101 (e.g., for calls) disposed in the first housing 110 and a speaker 102 disposed in the second housing 120. In some embodiments, the input device 103, the sound output devices 101 and 102, and the connector port 107 may be disposed in a space provided in the first housing 110 and/or the second housing 120 of the electronic device 100, and may be exposed to the exterior through at least one hole formed in the first housing 110 and/or the second housing 120. At least one connector port 107 may be used for transmitting and receiving power and/or data to and from an external electronic device. In some embodiments, at least one connector port (e.g., ear jack hole) may receive a connector (e.g., ear jack) for transmitting and receiving audio signals to and from an external electronic device. In some embodiments, holes formed in the first housing 110 and/or the second housing 120 may be commonly used for the input device 103 and the sound output devices 101 and 102. In some embodiments, the sound output devices 101 and 102 may include a speaker (e.g., piezo speaker) that is operative without holes formed in the first housing 110 and/or the second housing 120.

According to certain embodiments, the sensor module 104 may generate an electrical signal or data value corresponding to an internal operating state of the electronic device 100 or an external environmental state. The sensor module 104 may, for example, detect the external environment through the first surface 111 of the first housing 110. In some embodiments, the electronic device 100 may further include at least one sensor module for detecting qualities of an external environment through the second surface 112 of the first housing 110. The sensor module 104 (e.g., illuminance sensor) may be disposed under the flexible display 130 for detecting qualities of an external environment through the flexible display 130. The sensor module 104 may include at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, an illuminance sensor, a proximity sensor, or an ultrasonic sensor.

According to certain embodiments, the camera devices 105 and 108 may include a first camera device 105 (e.g., front camera device) disposed at the first surface 111 of the first housing 110, and a second camera device 108 disposed at the second surface 112 of the first housing 110. The electronic device 100 may further include a flash 109 disposed near the second camera device 108. The camera devices 105 and 108 may include a single lens or a plurality of lenses, an image sensor, and/or an image signal processor. The flash 109 may include, for example, a light emitting diode or a xenon lamp. The camera devices 105 and 108 may be disposed so that two or more lenses (e.g., wide angle lens, ultra-wide angle lens, or telephoto lens) and image sensors are positioned at one surface (e.g., the first surface 111, the second surface 112, the third surface 121, or the fourth surface 122) of the foldable electronic device 100. In some embodiments, the camera devices 105 and 108 may include lenses and/or an image sensor for time of flight (TOF).

According to certain embodiments, the key input device 106 (e.g., key button) may be disposed at the third side surface 113c of the first side frame 113 of the first housing 110. In some embodiments, the key input device 106 may be disposed in at least one side surface of the other side surfaces 113a and 113b of the first housing 110 and/or the side surfaces 123a, 123b, and 123c of the second housing 120. In some embodiments, the electronic device 100 may omit some or all of the key input devices 106 and omitted key input devices 106 may be implemented in some others form, such as soft keys, on the flexible display 130. In some embodiments, the key input device 106 may be implemented using a pressure sensor included in the flexible display 130.

According to certain embodiments, one camera (e.g., the first camera device 105) of the camera devices 105 and 108 or the sensor module 104 may be exposed through the flexible display 130. For example, the first camera device 105 or the sensor module 104 may be disposed so as to be in contact with an external environment through an opening (e.g., through hole) at least partially formed in the flexible display 130 in an internal space of the foldable electronic device 100. Some sensor modules 104 may be disposed to perform functions thereof without being visually exposed through the flexible display 130 in the internal space of the electronic device 100. In this case, an opening of an area facing the sensor module of the flexible display 130 may not be implemented.

With reference to FIG. 2B, the electronic device 100 may be configured so as to maintain an intermediate folded state through the hinge module (e.g., the hinge module 140 of FIG. 1B or FIG. 3). In this case, the electronic device 100 may control the flexible display 130 to display different contents in a display area (e.g., the first flat area 130a) corresponding to the first surface 111 and a display area (e.g., the second flat area 130b) corresponding to the third surface 121. The electronic device 100 may be configured so as to enter a substantially unfolded state (e.g., the unfolded state of FIG. 1A) and/or a substantially folded state (e.g., the folded state of FIG. 2A) based on a predetermined inflection angle (e.g., an angle between the first housing 110 and the second housing 120 in an intermediate folded state) through the hinge module (e.g., the hinge module 140 of FIG. 1B or FIG. 3). For example, in a state in which the electronic device 100 is unfolded at a predetermined inflection angle through the hinge module (e.g., the hinge module 140 of FIG. 1B or FIG. 3), when a pressure is provided in the unfolding direction (direction B), the electronic device 100 may be configured so as to be in an unfolded state (e.g., the unfolded state of FIG. 1A). For example, in a state in which the electronic device 100 is unfolded at a predetermined inflection angle through the hinge module (e.g., the hinge module 140 of FIG. 1B or FIG. 3), when a pressure is provided in the folding direction (direction C), the electronic device 100 may be configured so as to be in a closed state (e.g., the folded state of FIG. 2A). The electronic device 100 may be configured so as to maintain the folded or unfolded state at various angles through the hinge module (e.g., the hinge module 140 of FIG. 1B or FIG. 3).

FIG. 3 is an exploded perspective view illustrating an electronic device (e.g., foldable electronic device) according to certain embodiments of the disclosure.

Referring to FIG. 3, the electronic device 100 may include a first side frame 113 of a first housing 110, a second side frame 123 of the second housing 120, and a hinge module 140 (e.g., the hinge module 140 of FIG. 1B) for rotatably connecting the first side frame 113 and the second side frame 123.

According to an embodiment, the electronic device 100 may include a first support plate 1131 extending at least partially from the first side frame 113 of the first housing 110, and a second support plate 1231 extending at least partially from the second side frame 123 of the second housing 120. The first support plate 1131 may be integrally formed with the first side frame 113 or may be structurally coupled to the first side frame 113. The second support plate 1231 may be integrally formed with the second side frame 123 or may be structurally coupled to the second side frame 123. The electronic device 100 may include a flexible display 130 which is supported by the first support plate 1131 and the second support plate 1231.

According to an embodiment, the electronic device 100 may include a first rear cover 114 coupled to the first side frame 113 of the first housing 110 and providing a first space between the first rear cover 114 and the first support plate 1131 and a second rear cover 124 coupled to the second side frame 123 of the second housing 120 and providing a second space between the second rear cover 124 and the second support plate 1231. In some embodiments, the first side frame 113 and the first rear cover 114 may be integrally formed. In some embodiments, the second side frame 123 and the second rear cover 124 may be integrally formed.

According to an embodiment, the electronic device 100 may include a first housing 110 (e.g., the first housing 110 of FIG. 1A) provided through the first side frame 113, the first support plate 1131, and the first rear cover 114. The electronic device 100 may include a second housing 120 (e.g., the second housing 120 of FIG. 1A) provided through the second side frame 123, the second support plate 1231, and the second rear cover 124. The electronic device 100 may include a sub-display 131 disposed to be visible from the exterior through at least a partial area of the first rear cover 114.

According to certain embodiments, the electronic device 100 may include a first substrate assembly 161 (e.g., main printed circuit board) disposed in a first space between the first side frame 113 and the first rear cover 114, a camera assembly 163, a first battery 171, or a first bracket 151.

According to an embodiment, the camera assembly 163 may include a plurality of camera devices (e.g., the camera devices 105 and 108 of FIGS. 1A and 2A), and may be electrically connected to the first substrate assembly 161. The first bracket 151 may provide a support structure for supporting the first substrate assembly 161 and/or the camera assembly 163.

According to an embodiment, the electronic device 100 may include a second substrate assembly 162 (e.g., sub printed circuit board) disposed in a second space between the second side frame 123 and the second rear cover 124, an antenna 190 (e.g., coil member), a second battery 172, or a second bracket 152.

According to an embodiment, the electronic device 100 may include a wiring member 180 (e.g., flexible printed circuit board (FPCB)) extending towards a plurality of electronic components (e.g., the second substrate assembly 162, the second battery 172, or the antenna 190) disposed between the second side frame 123 and the second rear cover 124 across the hinge module 140 from the first substrate assembly 161, and providing an electrical connection thereto. The antenna 190 may include a near field communication (NFC) antenna, a wireless charging antenna, and/or a magnetic secure transmission (MST) antenna. The antenna 190 may, for example, perform short range communication with an external device or wirelessly transmit and receive power for charging.

According to certain embodiments, the electronic device 100 may include a hinge housing 141 (e.g., hinge cover) for supporting or covering the hinge module 140, and exposed to the outside when the electronic device 100 is in a folded state (e.g., the folded state of FIG. 2A) and entered into the first space and/or the second space when the electronic device 100 is in an unfolded state (e.g., the unfolded state of FIG. 1A) to be disposed invisibly from the outside.

Figure 4A:
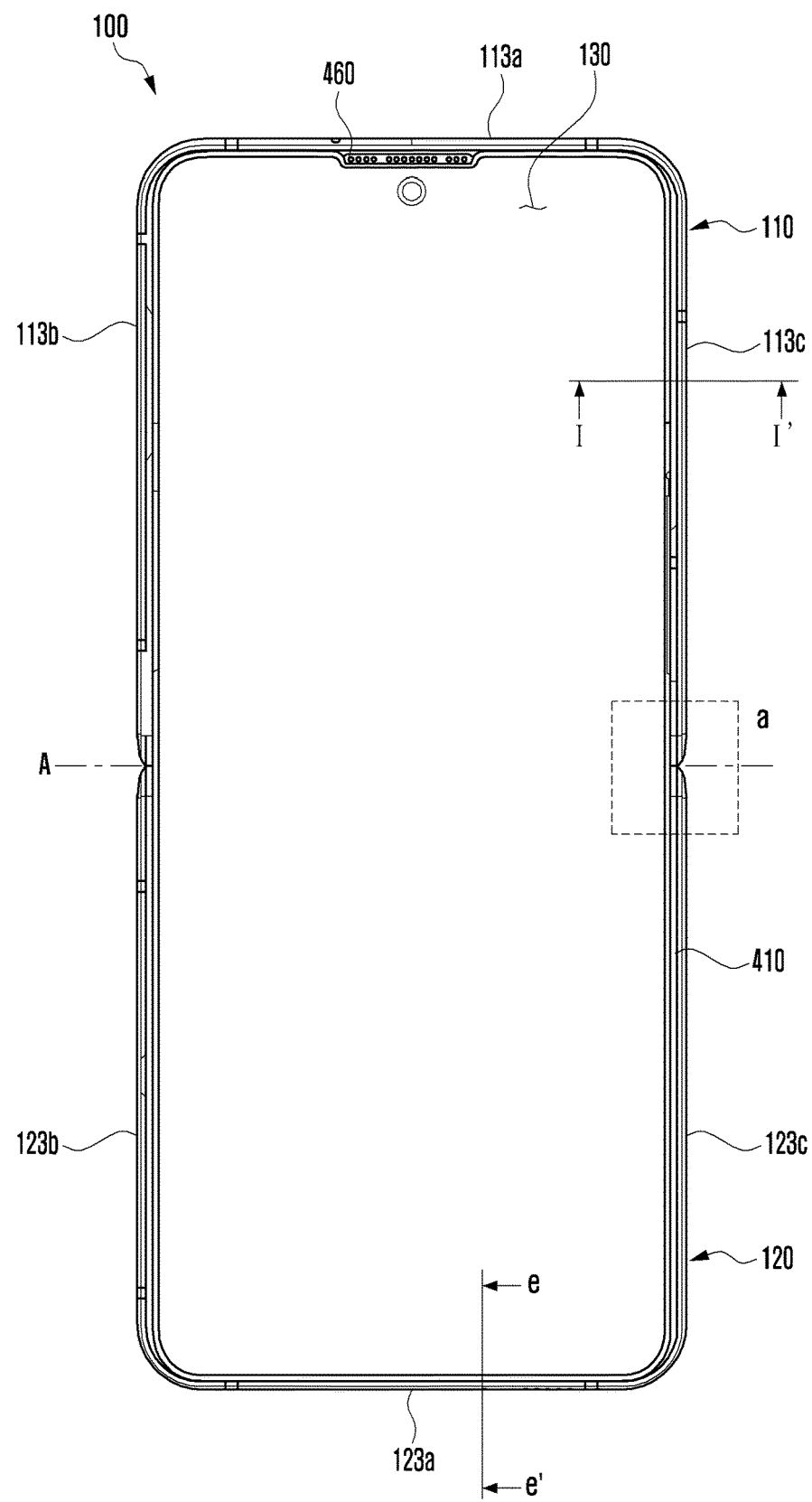
FIG. 4A is a diagram schematically illustrating an embodiment of a front surface of an electronic device in an unfolded state according to certain embodiments of the disclosure.
Figure 4B:
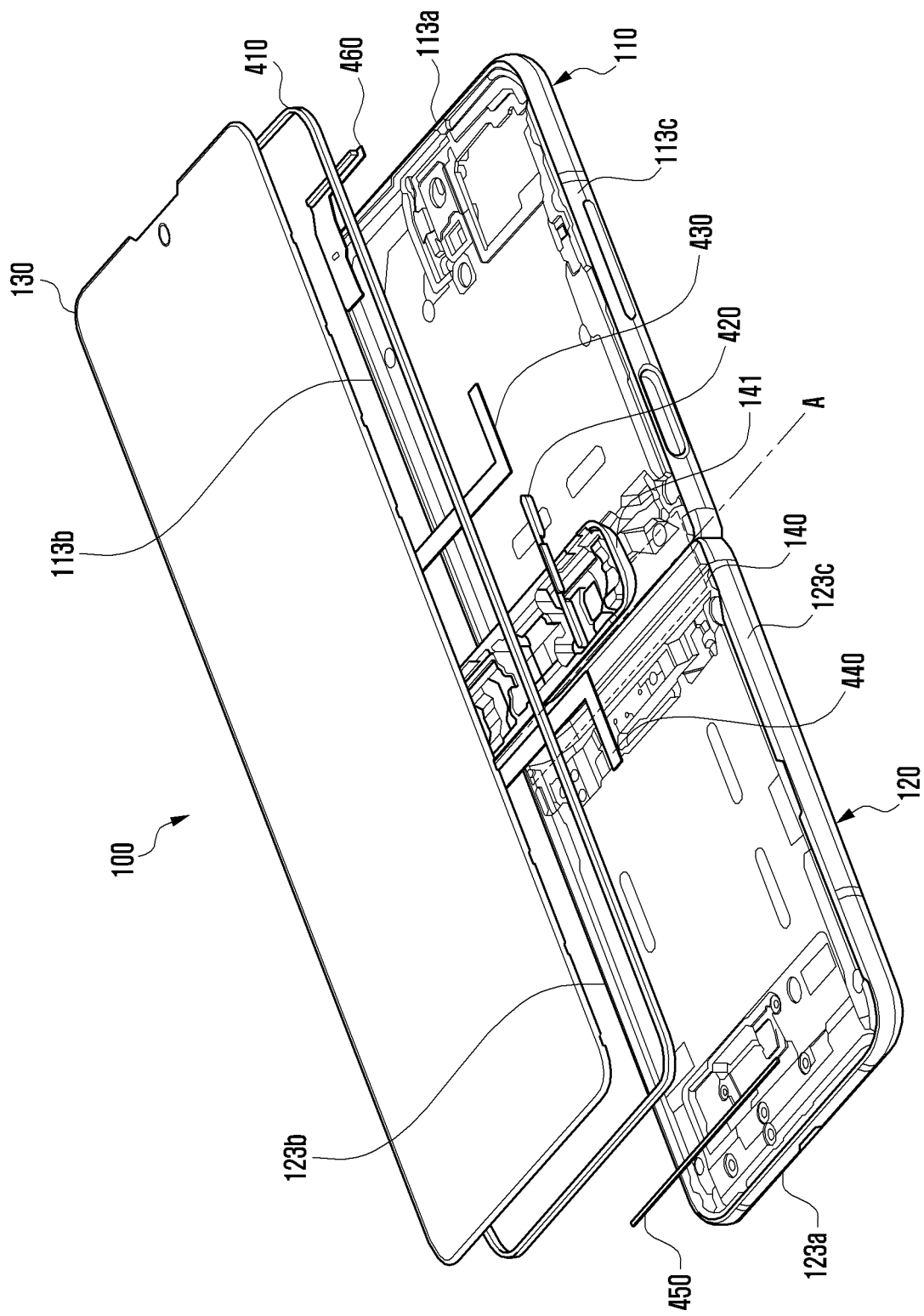
FIG. 4B is an exploded perspective view schematically illustrating an embodiment of a portion of an electronic device according to certain embodiments of the disclosure.

FIG. 4A is a diagram schematically illustrating an embodiment of a front surface of an electronic device in an unfolded state according to certain embodiments of the disclosure. FIG. 4B is an exploded perspective view schematically illustrating an embodiment of a portion of an electronic device according to certain embodiments of the disclosure.

According to certain embodiments, embodiments of the electronic device 100 illustrated below may include the embodiments illustrated in FIGS. 1A to 3. In the description of certain embodiments of the disclosure illustrated below, the same reference numerals may be assigned to the same components as those of the foregoing embodiments illustrated in FIGS. 1A to 3, and duplicate descriptions of functions thereof may be omitted.

With reference to FIGS. 4A and 4B, the electronic device 100 according to certain embodiments of the disclosure may include a first housing 110, a second housing 120, a flexible display 130, a hinge module 140, a hinge housing 141, a first sealing member 410, an elastic support member 420, a second sealing member 430, a third sealing member 440, a protection member 450, and/or a receiver plate 460.

According to an embodiment, the first housing 110 may be coupled to at least a portion of the first side of the hinge module 140. The first housing 110 may include a first side surface 113a, a second side surface 113b extending from one end of the first side surface 113a in a direction of the folding axis (axis A), and a third side surface 113c extended from the other end of the first side surface 113a in a direction of the folding axis (axis A). The first housing 110 may be configured to be folded and unfolded with the second housing 120 about the folding axis (axis A) of the hinge module 140.

According to an embodiment, at least a portion of the second housing 120 may be coupled to the second side of the hinge module 140. The second housing 120 may include a fourth side surface 123a, a fifth side surface 123b extending from one end of the fourth side surface 123a in a direction of the folding axis (axis A), and a sixth side surface 123c extended from the other end of the fourth side surface 123a in a direction of the folding axis (axis A). The second housing 120 may be configured to be folded and unfolded with the first housing 110 about the folding axis (axis A) of the hinge module 140.

According to an embodiment, the flexible display 130 may be disposed to be folded and/or unfolded on the first housing 110, the hinge module 140 (or the hinge housing 141), and the second housing 120. The flexible display 130 may span from the first surface 111 of the first housing 110 to at least a portion of the third surface 121 of the second housing 120 across the hinge module 140 (or the hinge housing 141).

According to an embodiment, the hinge module 140 may be disposed between the first housing 110 and the second housing 120, such that the first housing 110 and the second housing 120 may be rotatable about the hinge module 140. The hinge module 140 may be disposed such that the first housing 110 and the second housing 120 can be set in a folded state and/or an unfolded state based on the folding axis (axis A). The hinge module 140 may have a first side coupled to at least a portion of the first housing 110 and a second side coupled to at least a portion of the second housing 120.

According to an embodiment, the hinge housing 141 may support or cover the hinge module 140, and may be exposed to the exterior when the first housing 110 and the second housing 120 are in a folded state based on the folding axis (axis A), and may be stowed into the first space (e.g., an internal space of the first housing 110) and the second space (e.g., an internal space of the second housing 120) so as to be no longer visible from the exterior when the first housing 110 and the second housing 120 are in an unfolded state.

According to an embodiment, the first sealing member 410 may be disposed between the inner surface of the first housing 110, the inner surface of the second housing 120, and an outer surface of the flexible display 130. The first sealing member 410 may extend integrally along the outer surface of the flexible display 130 to be disposed in a rectangular (e.g., square or rectangular) shape. The first sealing member 410 may adhere between the inner surface of the first housing 110, the inner surface of the second housing 120, and the outer surface of the flexible display 130, and perform waterproofing and/or dustproofing against moisture and/or foreign substances entering into the electronic device 100. According to certain embodiments, the first sealing member 410 may include at least one of a filling member, a waterproof adhesive, a tape, waterproof dispensing, silicone, waterproof rubber, or urethane.

According to an embodiment, the elastic support member 420 may be disposed in a folding area 130c (e.g., the folding area 130c of FIG. 1B) formed at a position corresponding to the hinge module 140 or the hinge housing 141. The elastic support member 420 may be disposed perpendicular to the folding axis (axis A). The elastic support member 420 may be disposed between an outer surface of the first sealing member 410 adjacent to the folding area 130c, the inner surface of the first housing 110, and the inner surface of the second housing 120. The elastic support member 420 may support at least a portion of the first sealing member 410 disposed adjacent to the folding area 130c. The elastic support member 420 may prevent the first sealing member 410 disposed adjacent to the folding area 130c from being pushed out, towards a portion of the first housing 110 and a portion of the second housing 120 adjacent to the folding area 130c. The elastic support member 420 may be unfolded corresponding to the unfolded state of the first housing 110 and the second housing 120 and be folded corresponding to a folded state of the first housing 110 and the second housing 120. The elastic support member 420 may prevent deformation and/or movement of the first sealing member 410 that may occur as the first housing 110 and the second housing 120 are repeatedly unfolded and folded.

According to certain embodiments, the elastic support member 420 may be disposed in a portion (e.g., upper support surface) of the hinge housing 141, a portion of an inner surface of the first housing 110, and a portion of an inner surface of the second housing 120 in the folding area 130c. It is within the portion of the inner surface in which a portion of the first housing 110 coupled to the first side of the hinge module 140, and a portion of the second housing 120 coupled to the second side of the hinge module 140 are disposed, so as to support a portion of the outer surface of the first sealing member 410. For example, the elastic support member 420 may be made of a rubber or silicone material having a certain elasticity.

According to an embodiment, the second sealing member 430 may be disposed in at least a portion of the first housing 110, thereby performing a waterproofing and/or dustproofing function. The second sealing member 430 may extend from at least a portion of the second side surface 113b of the first housing 110 and at least a portion of the second side surface 113b to be disposed in at least a portion of the third side surface 113c. The second sealing member 430 may be, for example, disposed closer to the hinge module 140 than the first side surface 113a of the first housing 110.

According to an embodiment, the third sealing member 440 may be disposed in at least a portion of the second housing 120 and perform a waterproof and/or dustproof function. The third sealing member 440 may be disposed in at least a portion of the fifth side surface 123b of the second housing 120 and extend from at least a portion of the fifth side surface 123b to be disposed in at least a portion of the sixth side surface 123c. The third sealing member 440 may be, for example, disposed closer to the hinge module 140 than the fourth side surface 123a of the second housing 120.

According to certain embodiments, the second sealing member 430 and/or the third sealing member 440 may include at least one of a filling member, a waterproof adhesive, a tape, waterproof dispensing, silicone, waterproof rubber, or urethane.

According to an embodiment, the protection member 450 may be disposed inside the fourth side surface 123a of the second housing 120. The protection member 450 may protect a bending part (e.g., a bending part 820 of FIG. 8A) of the display panel, which may be a partial configuration of the flexible display 130. The protection member 450 may prevent the first sealing member 410 from contacting or intruding on the bending part (or an extended part of the display panel) of the display panel.

According to an embodiment, the receiver plate 460 may be disposed within the first side surface 113a of the first housing 110. The receiver plate 460 may provide a mounting surface for the sound output device 101 (e.g., speaker) of FIG. 1A. A fourth sealing member 1410 (e.g., a fourth sealing member 1410 of FIG. 14B) may be disposed at a rear surface of the receiver plate 460. The fourth sealing member 1410 may be disposed along an edge of the rear surface of the receiver plate 460. The fourth sealing member 1410 may include at least one of a waterproof adhesive, a tape, waterproof dispensing, silicone, waterproof rubber, or urethane. The receiver plate 460 may include a receiver decor or a receiver grill.

Figure 4C:
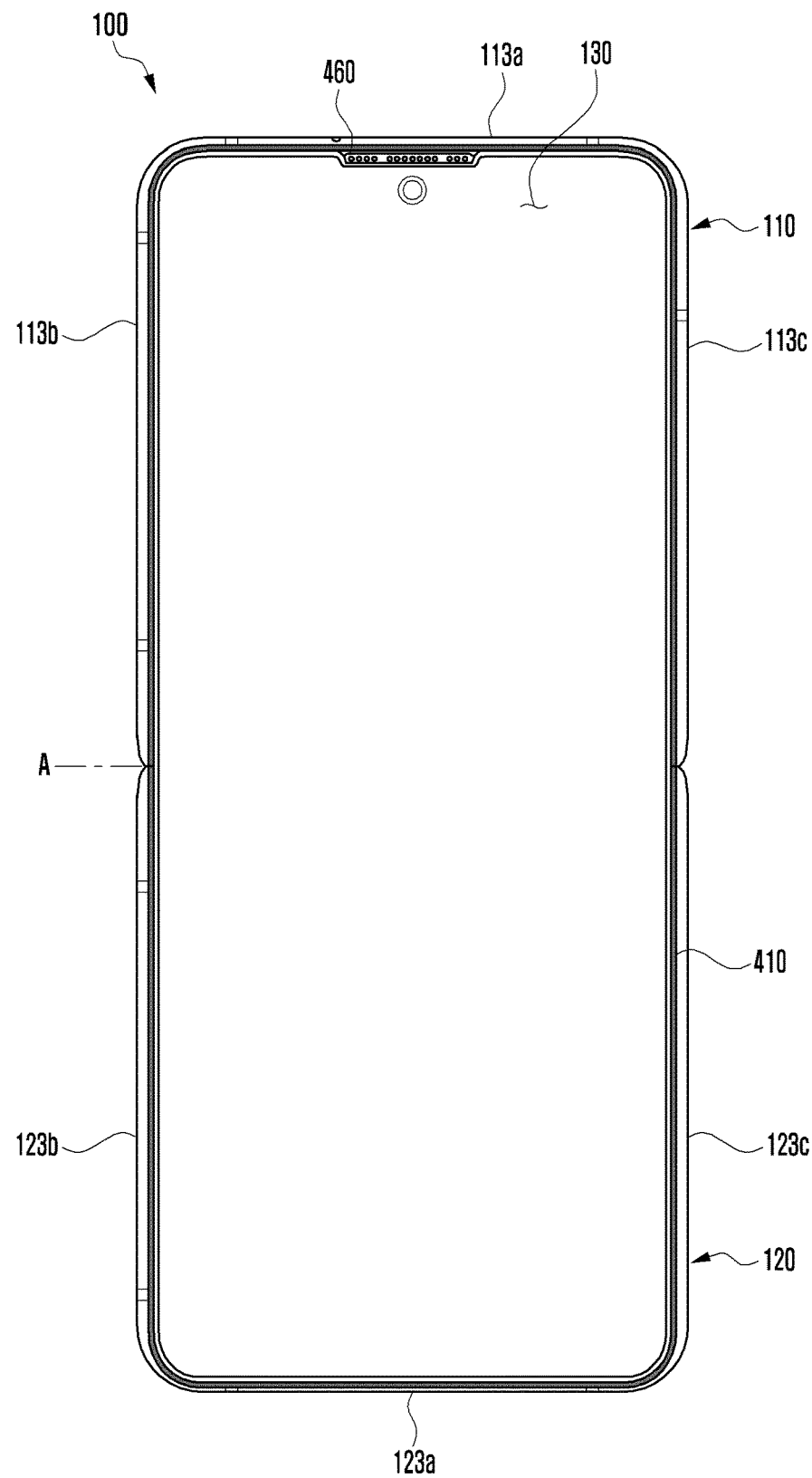
FIG. 4C is a diagram schematically illustrating another embodiment of a front surface of an electronic device in an unfolded state according to another embodiment of the disclosure.
Figure 4D:
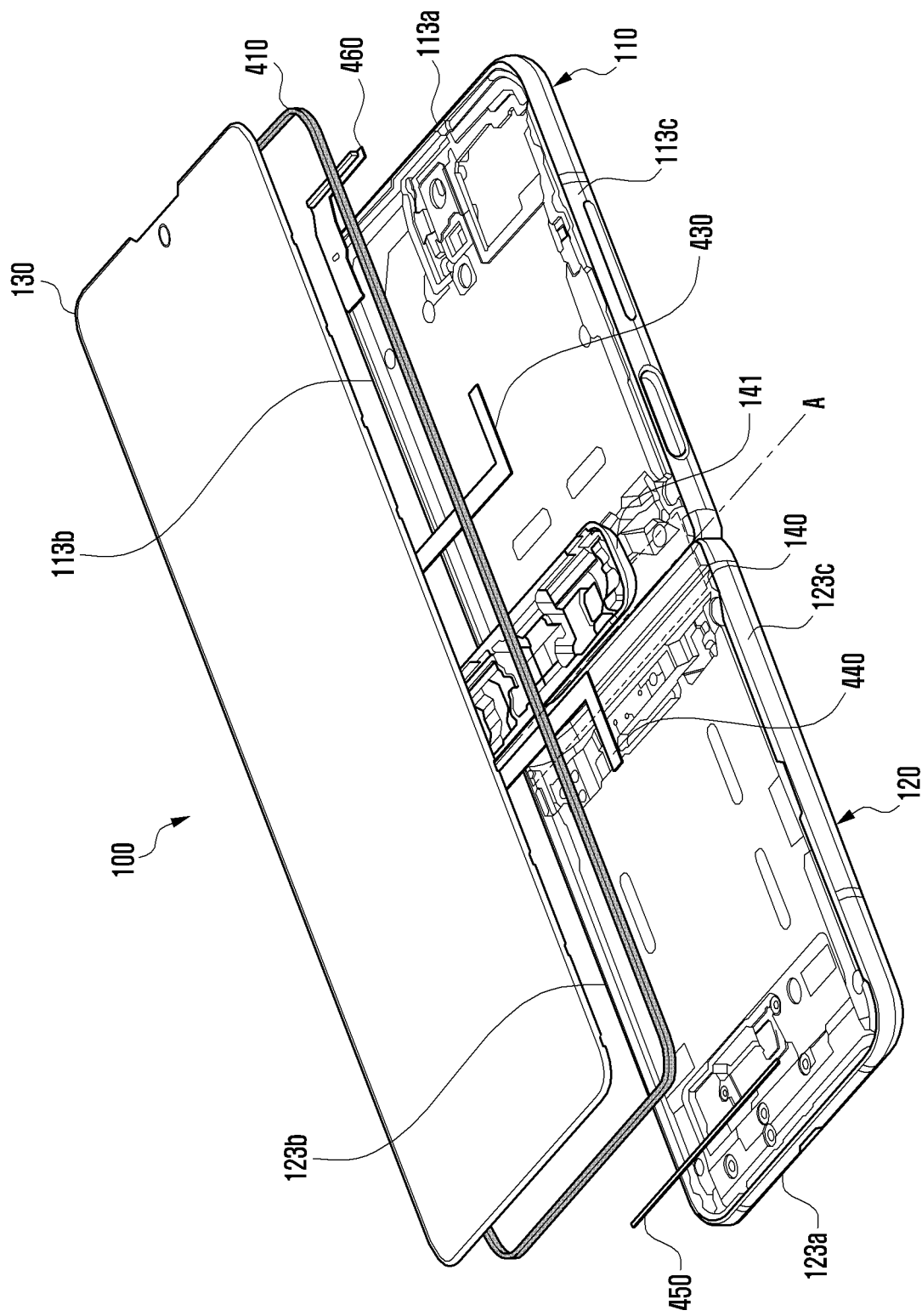
FIG. 4D is an exploded perspective view schematically illustrating another embodiment of a portion of an electronic device according to certain embodiments of the disclosure.

FIG. 4C is a diagram schematically illustrating another embodiment of a front surface of an electronic device in an unfolded state according to another embodiment of the disclosure. FIG. 4D is an exploded perspective view schematically illustrating another embodiment of a portion of an electronic device according to certain embodiments of the disclosure.

In the description of FIGS. 4C and 4D, the same reference numerals are assigned to the same components as those of the foregoing embodiment illustrated in FIGS. 4A and 4B, and duplicate descriptions of functions thereof may be omitted.

With reference to FIGS. 4C and 4D, in the electronic device 100 according to certain embodiments of the disclosure, the elastic support member 420 may be omitted, compared to the embodiments illustrated in FIGS. 4A and 4B. The electronic device 100 illustrated in FIGS. 4A and 4B may be configured substantially the same as the electronic device 100 illustrated in FIGS. 4C and 4D, except for the elastic support member 420.

According to certain embodiments, the electronic device 100 according to certain embodiments of the disclosure may include a first housing 110, a second housing 120, a flexible display 130, a hinge module 140, a hinge housing 141, a first sealing member 410, a second sealing member 430, a third sealing member 440, a protection member 450, and/or a receiver plate 460.

According to an embodiment, the flexible display 130 may be folded and/or unfolded on the first housing 110, the hinge module 140 (or the hinge housing 141), and the second housing 120. The flexible display 130 may extend from the first surface 111 of the first housing 110 to at least a portion of the third surface 121 of the second housing 120, across the hinge module 140 (or the hinge housing 141).

According to an embodiment, the first sealing member 410 may be disposed between the inner surface of the first housing 110, the inner surface of the second housing 120, and the outer surface of the flexible display 130. The first sealing member 410 may extend integrally along the outer surface of the flexible display 130 so as to be disposed in a rectangular shape. The first sealing member 410 may adhere between the inner surface of the first housing 110, the inner surface of the second housing 120, and the outer surface of the flexible display 130, and perform a waterproofing and/or dustproofing function to protect against intrusion by moisture and/or foreign substances entering into the electronic device 100.

According to an embodiment, the second sealing member 430 may be disposed in at least a portion of the first housing 110 and perform a waterproofing and/or dustproofing function. The second sealing member 430 may be disposed in at least a portion of the second side surface 113b of the first housing 110 and extend from at least a portion of the second side surface 113b to be disposed in at least a portion of the third side surface 113c.

According to an embodiment, the third sealing member 440 may be disposed in at least a portion of the second housing 120 and perform a waterproofing and/or dustproofing function. The third sealing member 440 may be disposed in at least a portion of the fifth side surface 123b of the second housing 120 and extend from at least a portion of the fifth side surface 123b to be disposed in at least a portion of the sixth side surface 123c.

According to an embodiment, the protection member 450 may be disposed inside the fourth side surface 123a of the second housing 120. The protection member 450 may protect the bending part (e.g., the bending part 820 of FIG. 8A) of the display panel, which a partial region of the flexible display 130. The protection member 450 may prevent the first sealing member 410 from contacting or intruding on the bending part 820 of the display panel.

According to an embodiment, the receiver plate 460 may be disposed inside the first side surface 113a of the first housing 110. The receiver plate 460 may providing a mounting surface for the sound output device 101 of FIG. 1A. A fourth sealing member 1410 (e.g., the fourth sealing member 1410 of FIG. 14B) may be disposed at the rear surface of the receiver plate 460. The fourth sealing member 1410 may be disposed along an edge of the rear surface of the receiver plate 460.

Figure 5A:
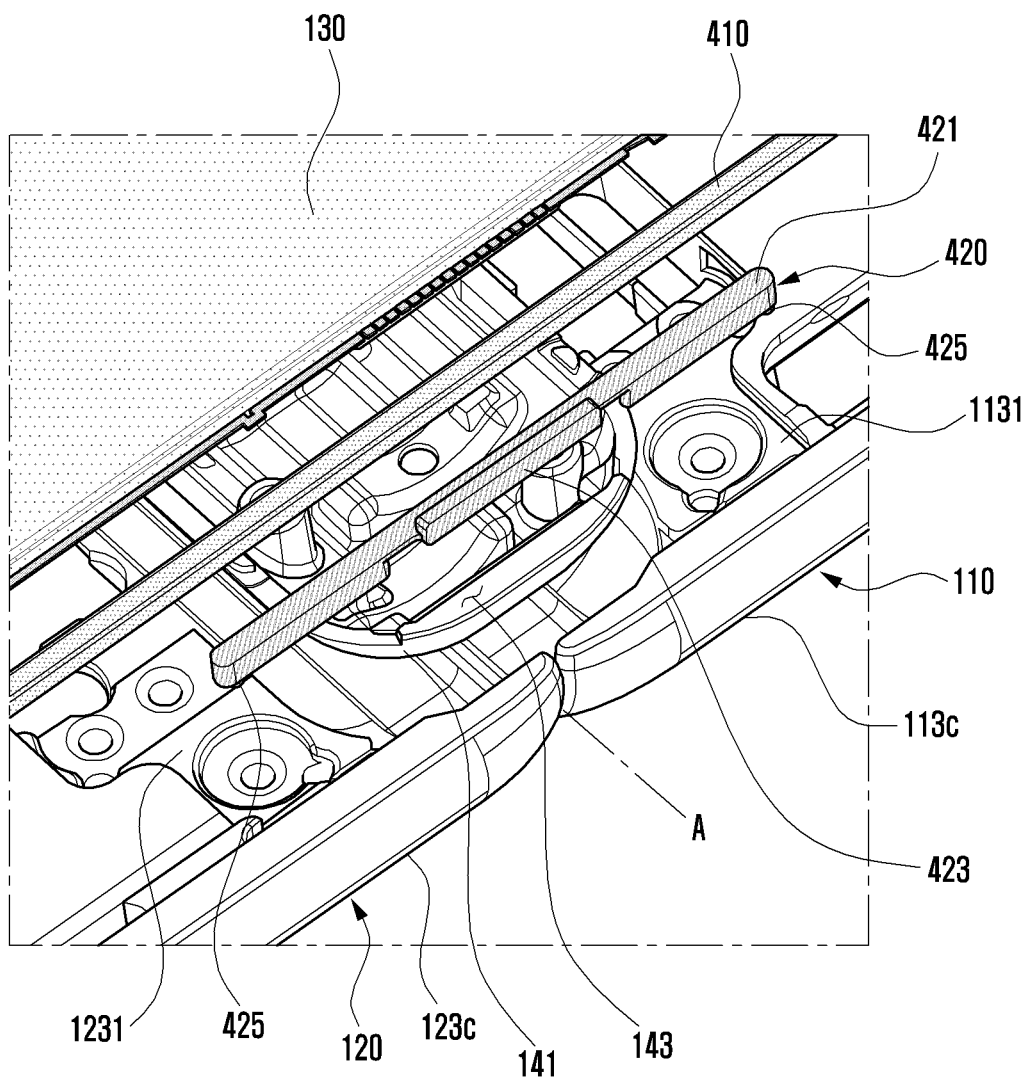
FIG. 5A is an enlarged exploded perspective view illustrating a portion a of the electronic device illustrated in FIG. 4A according to certain embodiments of the disclosure.
Figure 5B:
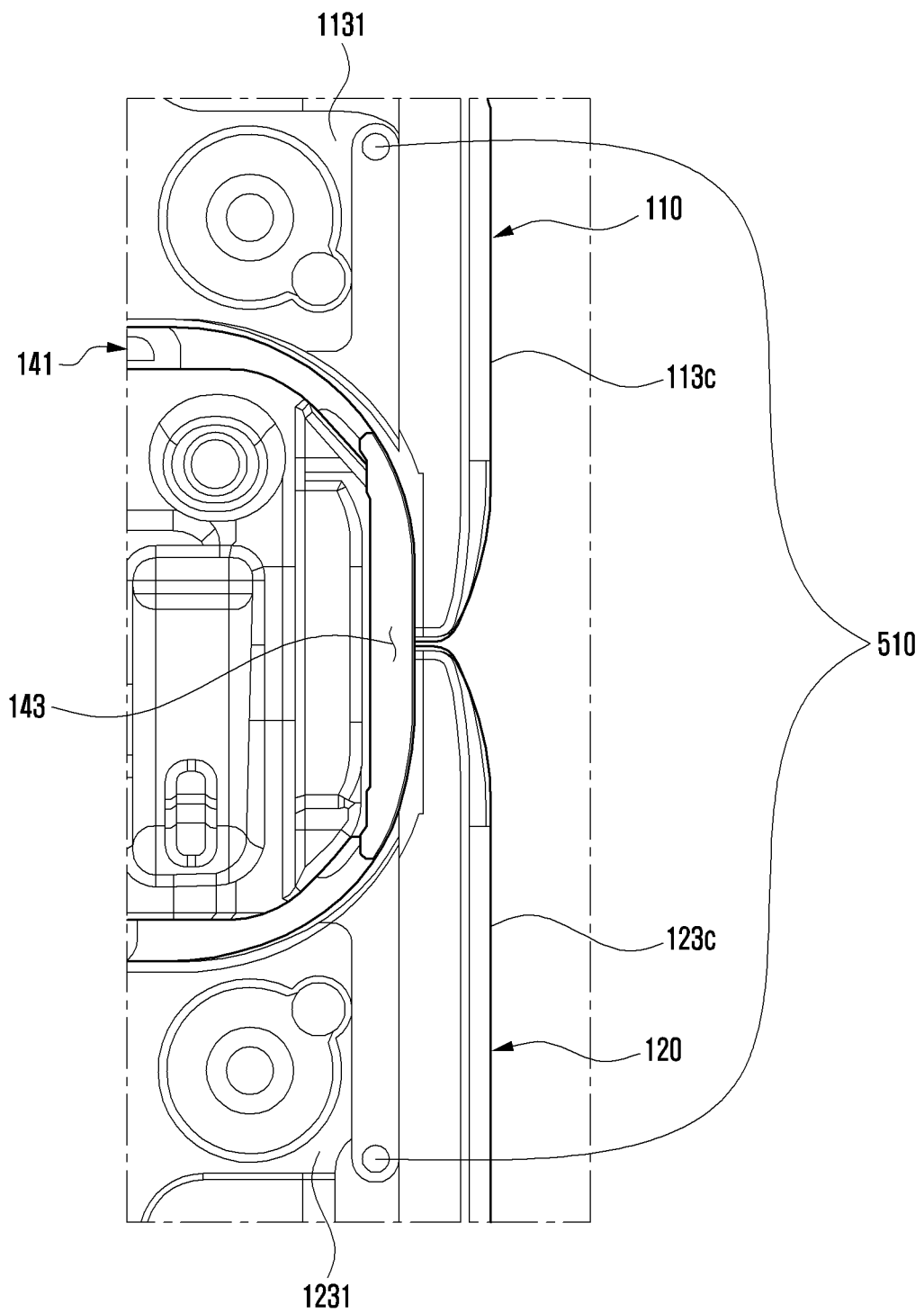
FIG. 5B is an enlarged plan view illustrating a portion a of the electronic device illustrated in FIG. 4A according to certain embodiments of the disclosure.
Figure 5C:
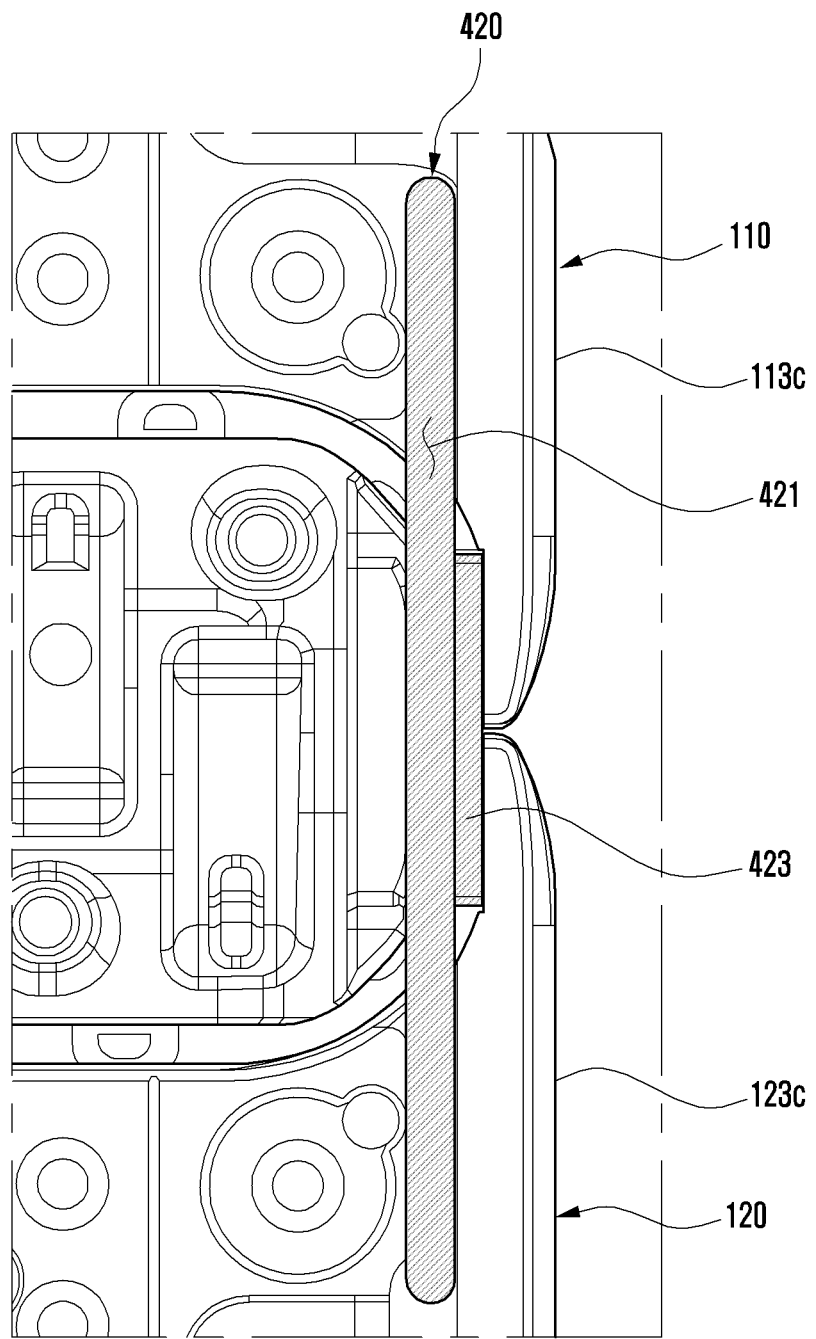
FIG. 5C is an enlarged plan view illustrating a configuration in which an elastic support member is disposed in a portion a of the electronic device illustrated in FIG. 4A according to certain embodiments of the disclosure.
Figure 5D:
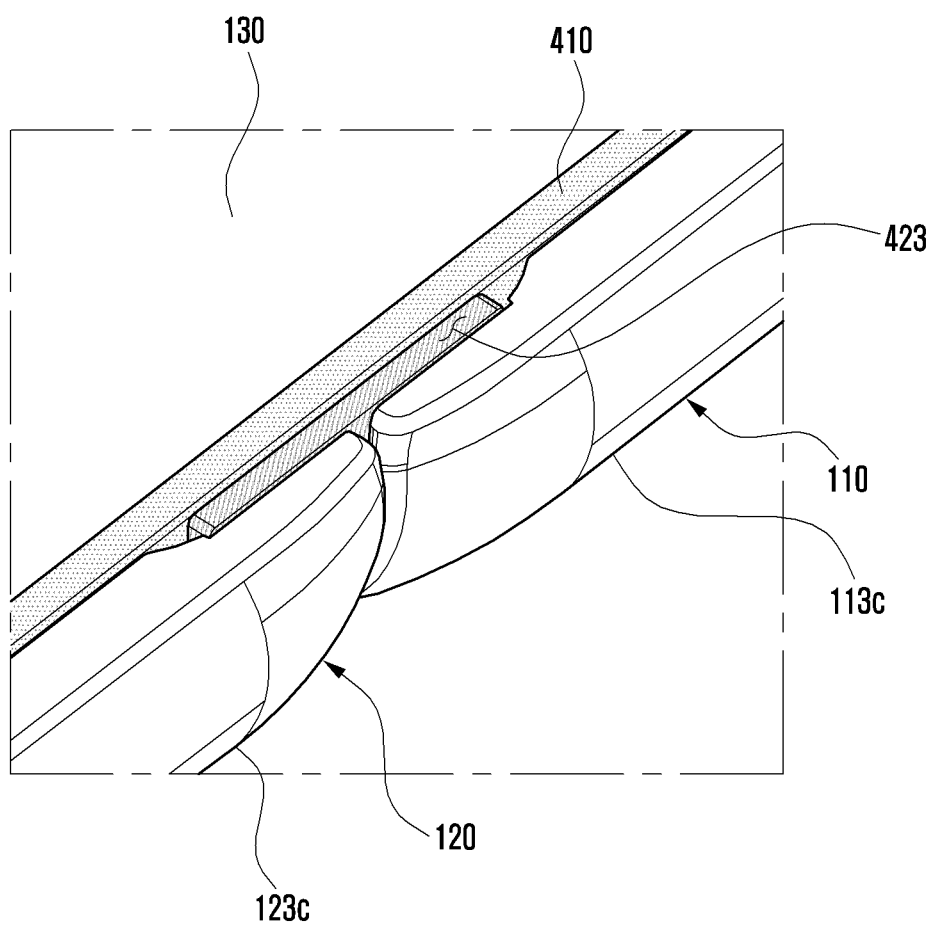
FIG. 5D is an enlarged perspective view illustrating a state in which a first sealing member and an elastic support member are disposed in a portion a of the electronic device illustrated in FIG. 4A according to certain embodiments of the disclosure.

FIGS. 5A to 5B are enlarged views illustrating a portion "a" of the electronic device illustrated in FIG. 4A. FIG. 5A is an enlarged exploded perspective view illustrating a portion "a" of the electronic device illustrated in FIG. 4A. FIG. 5B is an enlarged plan view illustrating a portion a of the electronic device illustrated in FIG. 4A. FIG. 5C is an enlarged plan view illustrating a configuration in which an elastic support member is disposed in a portion a of the electronic device illustrated in FIG. 4A. FIG. 5D is an enlarged perspective view illustrating a state in which a first sealing member and an elastic support member are disposed in a portion a of the electronic device illustrated in FIG. 4A.

Referring to FIGS. 5A to 5D, in the electronic device 100 according to certain embodiments of the disclosure, a portion (e.g., the second side surface 113b and the third side surface 113c) of the first housing 110 and a portion (e.g., the fifth side surface 123b and the sixth side surface 123c) of the second housing 120 may be folded or unfolded based on the folding axis (axis A).

According to an embodiment, the first sealing member 410 may be disposed between the inner surface of the first housing 110, the inner surface of the second housing 120, and the outer surface of the flexible display 130.

According to an embodiment, the elastic support member 420 may be disposed in a portion (e.g., the second side surface 113b and the third side surface 113c) of the first housing 110, a portion (e.g., the support surface 143) of the hinge housing 141 (or the hinge module 140), and a portion (e.g., the fifth side surface 123b and the sixth side surface 123c) of the second housing 120.

According to certain embodiments, the elastic support member 420 may be disposed between the first sealing member 410 in the folding area 130c (e.g., the folding area of FIG. 1B), a portion of the first housing 110, and a portion of the second housing 120. In the folded region 130c in which a portion of the first housing 110 coupled to the first side of the hinge module 140 and a portion of the second housing 120 coupled to the second side of the hinge module 140 are disposed, the elastic support member 420 may be disposed in a portion of the hinge housing 141, a portion of the inner surface of the first housing 110, and a portion of the inner surface of the second housing 120, to support at least a portion of the outer surface of the first sealing member 410.

According to certain embodiments, the elastic support member 420 may include a support part 421, a rib 423, and/or a fastening protrusion 425. The support part 421 may be disposed at the support surface 143 formed on one side or the other side of the hinge housing 141. The rib 423 may protrude upwards from a side surface of an intermediate point of the support part 421. The rib 423 may prevent a portion of the first sealing member 410 disposed in the folding area 130c (e.g., the folding area of FIG. 1B) from being expelled to an exterior of a portion of the first housing 110 and a portion of the second housing 120. The fastening protrusion 425 may be formed adjacent to one end and the other end of the rear surface of the support part 421. The fastening protrusion 425 may be coupled to at least one fastening hole 510 formed at a specified position of the first support plate 1131 of the first housing 110 and the second support plate 1231 of the second housing 120.

Figure 6A:
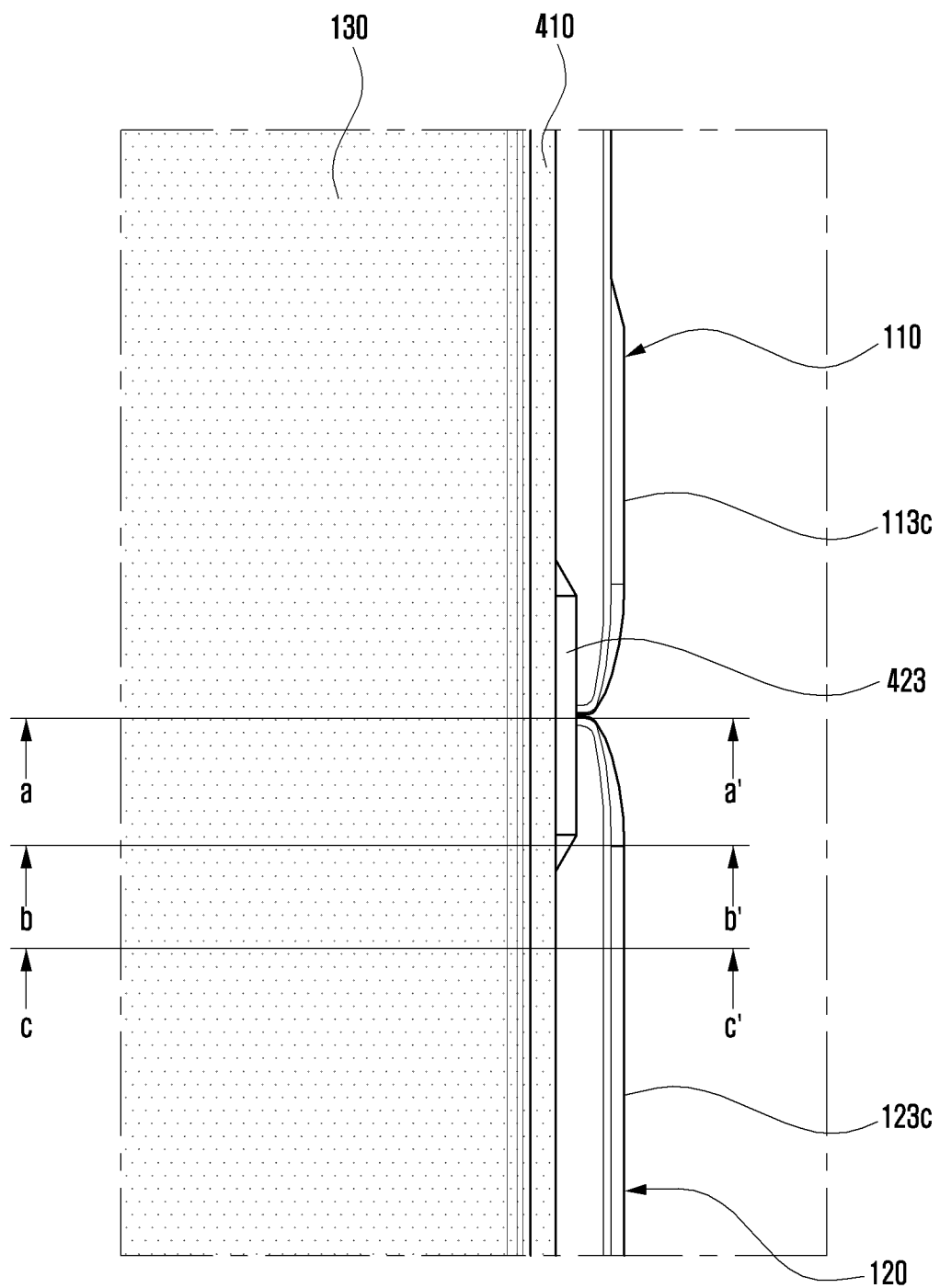
FIG. 6A is a diagram illustrating a portion a of the electronic device illustrated in FIG. 4A according to certain embodiments of the disclosure.
Figure 6B:
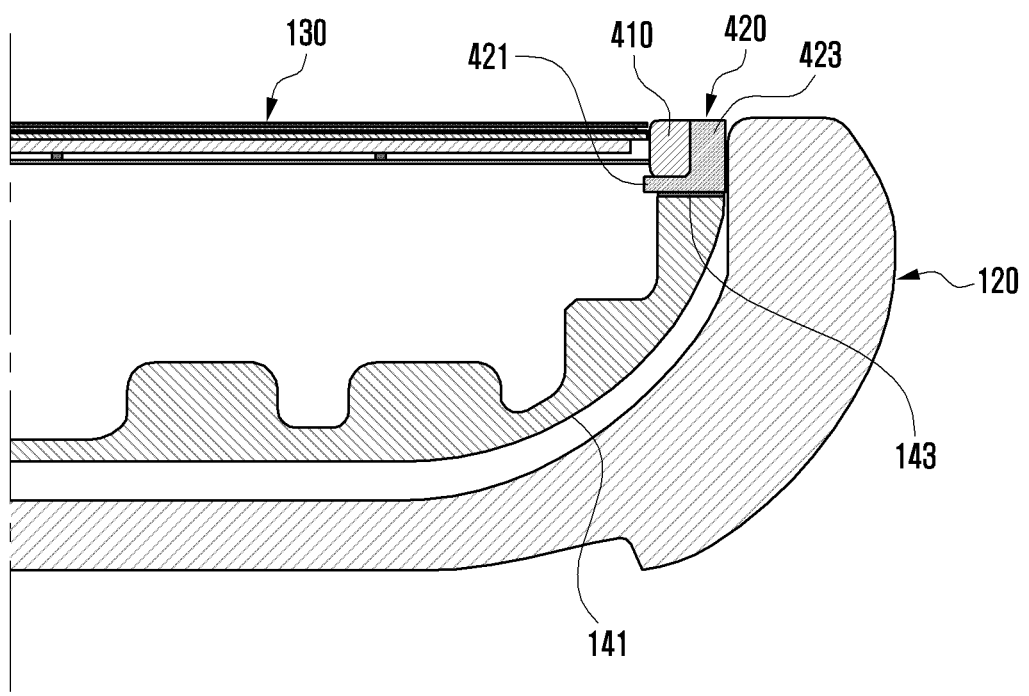
FIG. 6B is a cross-sectional view illustrating an embodiment of a portion a-a' of FIG. 6A according to certain embodiments of the disclosure.
Figure 6C:
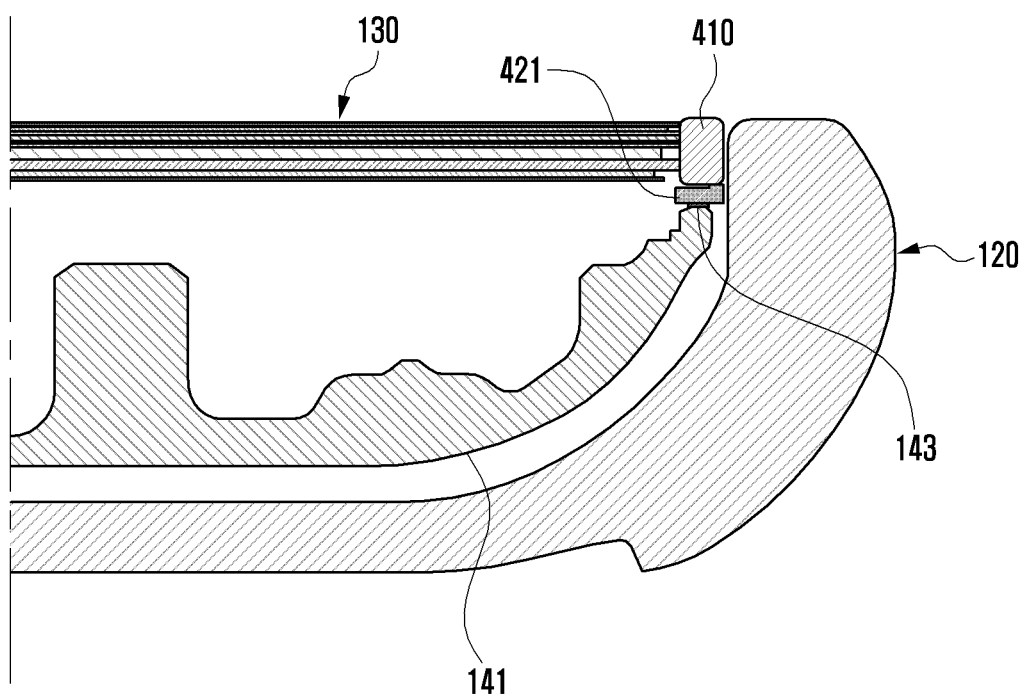
FIG. 6C is a cross-sectional view illustrating a portion b-b' of FIG. 6A according to certain embodiments of the disclosure.
Figure 6D:
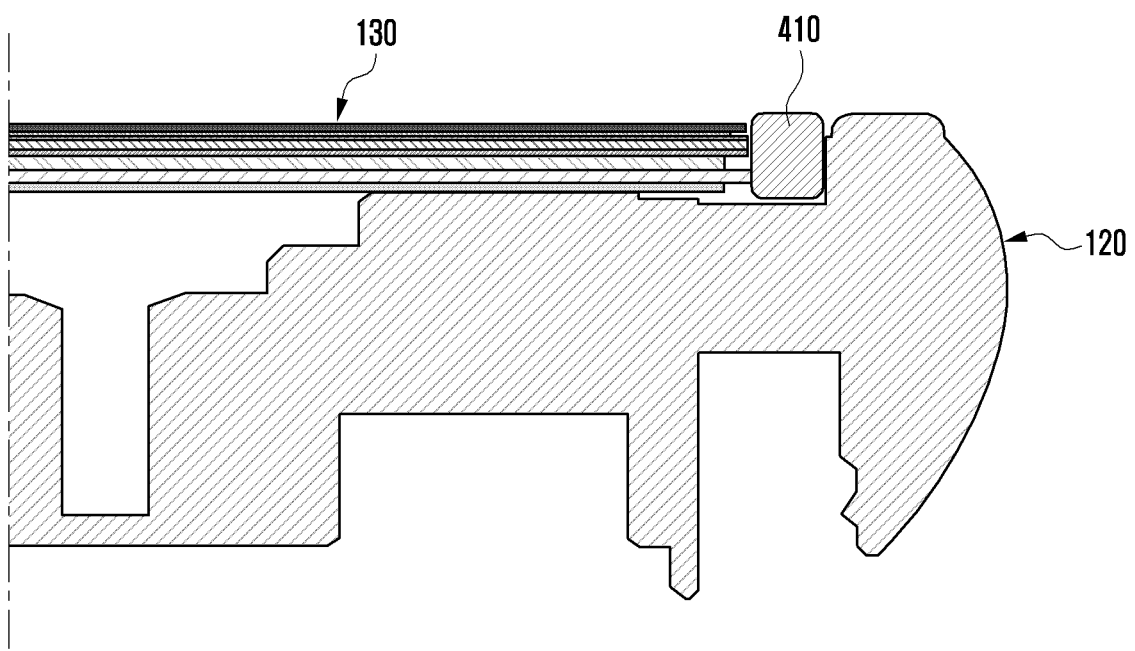
FIG. 6D is a cross-sectional view illustrating a portion c-c' of FIG. 6A according to certain embodiments of the disclosure.
Figure 6E:
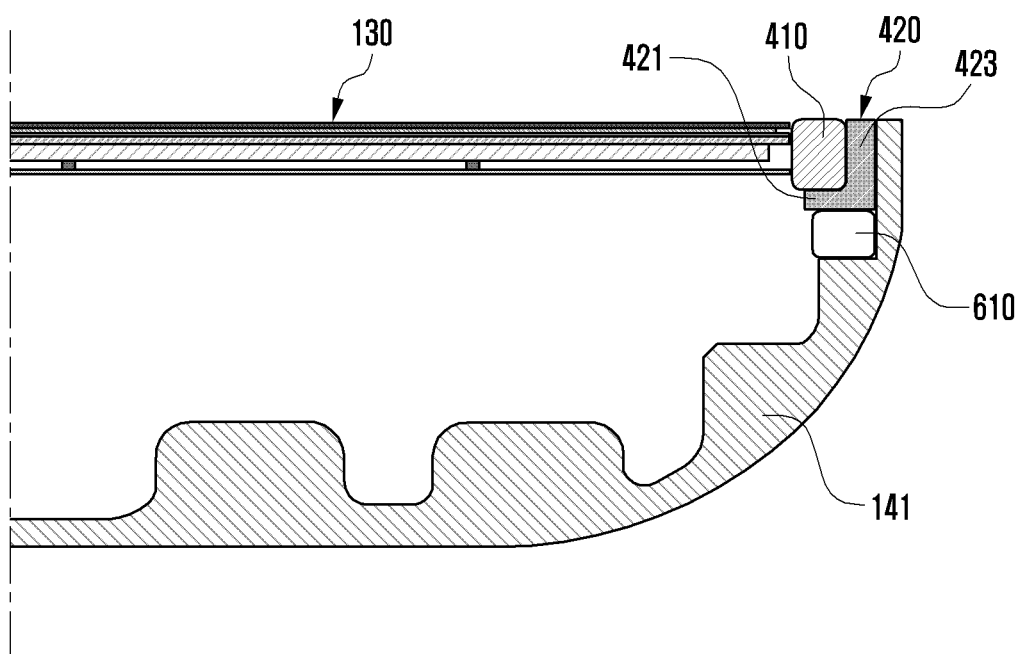
FIG. 6E is a cross-sectional view illustrating certain embodiments of a portion a-a' of FIG. 6A according to certain embodiments of the disclosure.

FIG. 6A is a diagram illustrating a portion a of the electronic device illustrated in FIG. 4A. FIG. 6B is a cross-sectional view illustrating an embodiment of a portion a-a' of FIG. 6A. FIG. 6C is a cross-sectional view illustrating a portion b-b' of FIG. 6A. FIG. 6D is a cross-sectional view illustrating a portion c-c' of FIG. 6A. FIG. 6E is a cross-sectional view illustrating certain embodiments of a portion a-a' of FIG. 6A.

As illustrated in FIGS. 6A and 6B, referring to a cross-sectional view according to an embodiment of the portion a-a' of FIG. 6A, in the elastic support member 420, a support part 421 may be disposed on the support surface 143 of the hinge housing 141, and the rib 423 may be supported by a portion of the sixth side surface 123c of the second housing 120. The first sealing member 410 may be disposed between the outer surface of the flexible display 130 and the support part 421 and the rib 423 of the elastic support member 420.

As illustrated in FIGS. 6A and 6C, referring to the cross-sectional view of a portion b-b' of FIG. 6A, the support part 421 of the elastic support member 420 may be disposed at least partially on the support surface 143 of the hinge housing 141. The first sealing member 410 may be disposed between the outer surface of the flexible display 130 and the support part 421 of the elastic support member 420 and a portion (e.g., the sixth side surface 123c) of the second housing 120.

As illustrated in FIGS. 6A and 6D, referring to a cross-sectional view of a portion c-c' of FIG. 6A, the first sealing member 410 may be disposed between the outer surface of the flexible display 130 and a portion (e.g., the sixth side surface 123c) of the second housing 120.

As illustrated in FIGS. 6A and 6E, referring to a cross-sectional view according to certain embodiments of a portion a-a' of FIG. 6A, at least a portion of the hinge housing 141 may be cut. The cut area may be formed a first and second end (e.g., opposing ends) of the hinge housing 141. A dustproof member 610 may be disposed in the cut area. The dustproof member 610 may be disposed under the support part 421 of the elastic support member 420. The dustproof member 610 may include, for example, at least one of a sponge, rubber, or silicone material. The dustproof member 610 may also perform a waterproofing function.

With reference to FIG. 6E, the support part 421 of the elastic support member 420 may be disposed on the dustproof member 610 in the cutting area of the hinge housing 141. The rib 423 of the elastic support member 420 may be supported by an outer surface of the hinge housing 141. The first sealing member 410 may be disposed between the outer surface of the flexible display 130 and the support part 421 and the rib 423 of the elastic support member 420.

Figure 7B:
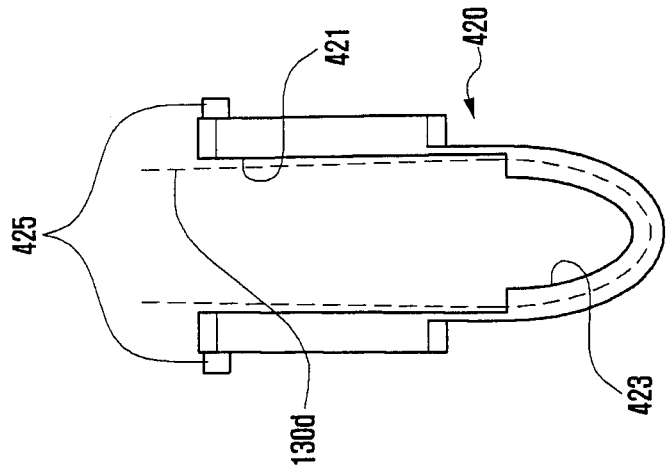
FIG. 7B is a diagram illustrating an elastic support member in a folded state according to certain embodiments of the disclosure.
Figure 7A:
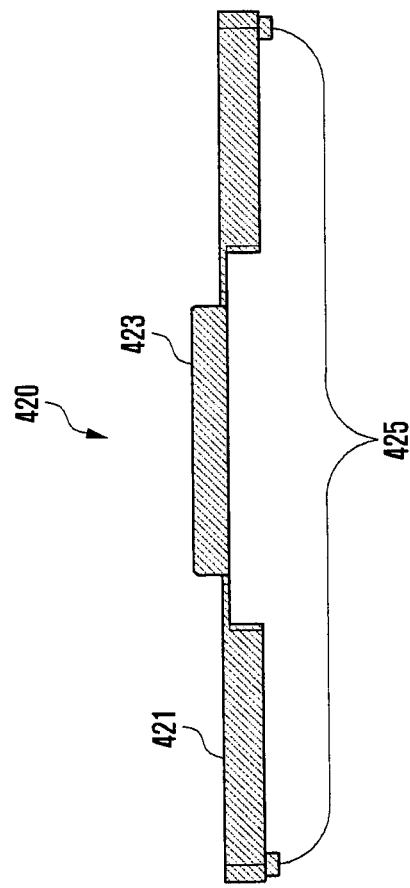
FIG. 7A is a diagram illustrating an elastic support member in an unfolded state according to certain embodiments of the disclosure.

FIG. 7 is a diagram illustrating an elastic support member according to certain embodiments of the disclosure. FIG. 7A is a diagram illustrating an elastic support member in an unfolded state. FIG. 7B is a diagram illustrating an elastic support member in a folded state.

With reference to FIG. 7A, when the first housing 110 and the second housing 120 are in an unfolded state, the elastic support member 420 may be unfolded to correspond to the unfolded state.

With reference to FIG. 7B, when the first housing 110 and the second housing 120 are in a folded state, the elastic support member 420 may be folded so as to correspond to the folded state.

According to an embodiment, as the first housing 110 and the second housing 120 are folded to face each other, when the flexible display 130 is folded, the rib 423 of the elastic support member 420 may be configured to have a thickness and material (e.g., rubber) capable of receiving a neutral area 130d (e.g., a neutral area 1010 of FIG. 10) and adjusting for a change in the length of the flexible display 130.

According to certain embodiments, the elastic support member 420 may be disposed in the folding area 130c (e.g., the folding area 130c of FIG. 1B) adjacent to the hinge module 140 and/or the hinge housing 141. The elastic support member 420 may be disposed between a portion of an outer surface of the first sealing member 410 adjacent to the folding area 130c, a portion of an inner surface of the first housing 110, and a portion of an inner surface of the second housing 120 and support at least a portion of the first sealing member 410.

FIGS. 8A to 8E are cross-sectional views illustrating an embodiment of a portion e-e' of the electronic device illustrated in FIG. 4A. FIGS. 8A to 8E are cross-sectional views illustrating a state in which a bending part of the flexible display is exposed to the outside of a window.

According to certain embodiments, FIGS. 8A to 8E illustrate a cross-section of a portion of the fourth side surface 123a of the second housing 120 of the electronic device 100 illustrated in FIG. 4A.

Figure 8A:
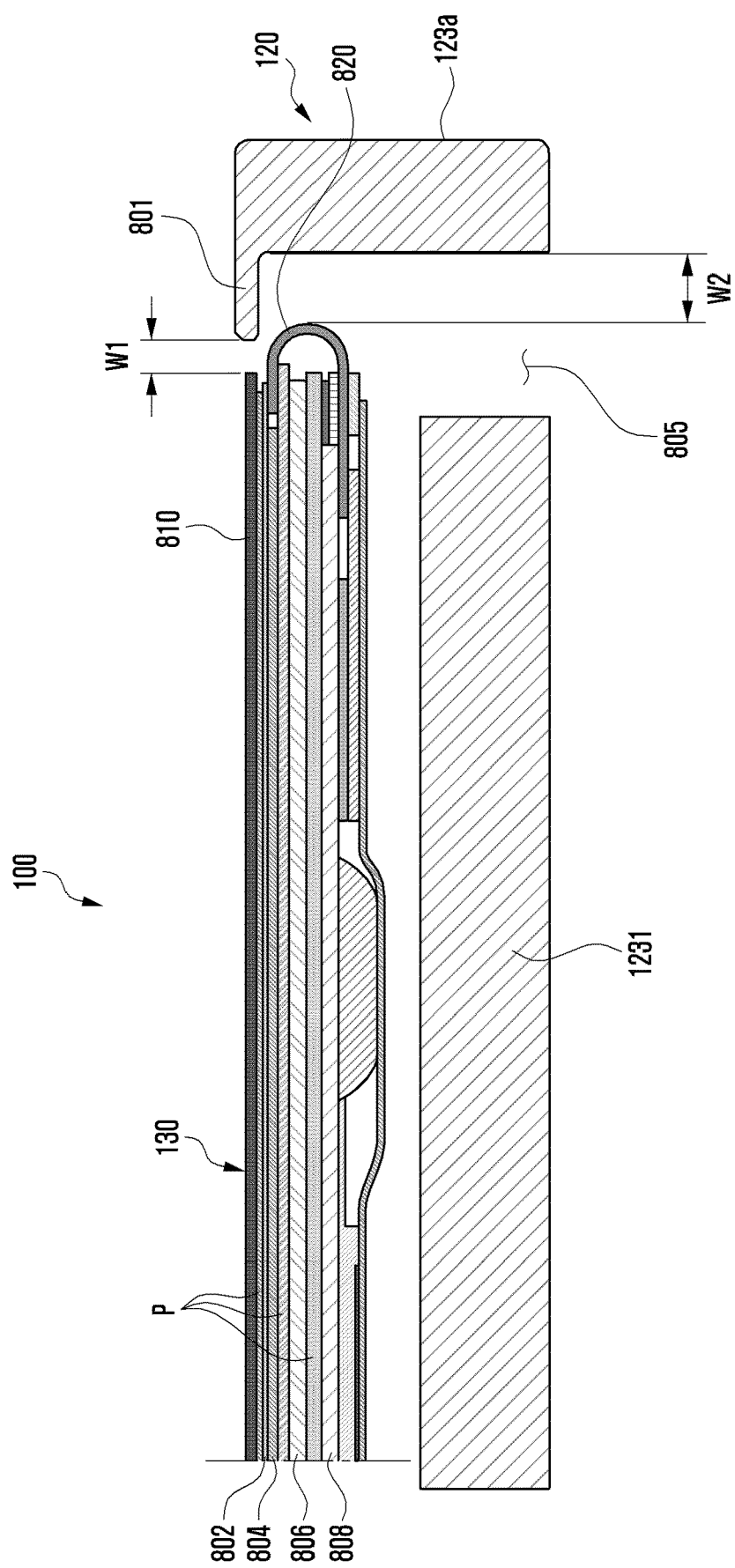

With reference to FIG. 8A, in the flexible display 130 of the electronic device 100 according to certain embodiments of the disclosure, a bending part 820 of a display panel 804 may be exposed outside a window 810. The bending part 820 of the display panel 804 may include a chip on panel.

According to certain embodiments, the flexible display 130 may include a window 810 (e.g., protective layer), a polarizer 802 (e.g., polarizing film), a display panel 804, a polymer member 806, and a metal sheet layer 808 sequentially disposed under the window 810.

According to certain embodiments, the window 810 may include a polymer layer and/or a glass layer laminated with the polymer layer. The window 810 may include polyethylene terephthalate (PET) or polyimide (PI) as the polymer layer, and include ultra-thin glass (UTG) as the glass layer. The window 810 may be configured with a glass layer (e.g., UTG) and a polymer layer (PET or PI) stacked on the glass layer and corresponding to an external environment.

According to certain embodiments, the window 810, the polarizer 802, the display panel 804, the polymer member 806, and/or the metal sheet layer 808 may be attached using an adhesive "P" disposed therebetween. For example, the adhesive P may include at least one of an optical clear adhesive (OCA), a pressure sensitive adhesive (PSA), a heat-reactive adhesive, a general adhesive, or a double-sided tape.

According to certain embodiments, the polymer member 806 may include a cushion for absorbing external impacts to the electronic device 100 to prevent damage to and/or breakage of the flexible display 130. In some embodiments, the polymer member 806 may be disposed under the metal sheet layer 808.

According to certain embodiments, the metal sheet layer 808 may help to reinforce rigidity of the electronic device 100. The metal sheet layer 808 may shield noise around the electronic device 100. The metal sheet layer 808 may be used for dissipating a heat emitted from a heat dissipating component mounted on a printed circuit board (not illustrated) and providing flexibility to the flexible display 130. The metal sheet layer 808 may include at least one of steel use stainless (SUS) (e.g., stainless steel (STS)), Cu, Al, or CLAD (e.g., a lamination member in which SUS and Al are alternately disposed). In other embodiments, the metal sheet layer 808 may include other alloy materials.

According to certain embodiments, the flexible display 130 may further include a detection member (not illustrated) for detecting an input by an electromagnetic induction type writing member (e.g., stylus pen). For example, the detection member may include a digitizer. The detection member (e.g., digitizer) may be disposed between the display panel 804 and at least one polymer member 806. In another embodiment, the detection member may be disposed under the metal sheet layer 808, and the metal sheet layer 808 may include structures (e.g., a plurality of openings) facilitating detection of the corresponding signal (e.g., resonance frequency) of the electronic pen by the detection member.

According to certain embodiments, the flexible display 130 may include at least one functional member (not illustrated) disposed between the polymer member 806 and the metal sheet layer 808. For example, the functional member may include a graphite sheet for heat dissipation, a force touch flexible printed circuit board (FPCB), a fingerprint sensor FPCB, an antenna radiator for communication, a heat dissipation sheet, a conductive/non-conductive tape, and/or an open cell sponge.

According to an embodiment, the fourth side surface 123a of the second housing 120 may include an extension part 801 integrally extending from the upper portion. A first separation space "w1" may be formed between the window 810 and the extension part 801 of the flexible display 130. The first separation space w1 may include a first width. An opening 805 may be formed between the fourth side surface 123a of the second housing 120 and the second support plate 1231 (e.g., the second support plate 1231 of FIG. 3). A second separation space "w2" may be formed between the fourth side surface 123a of the second housing 120 and the bending part 820 of the display panel. The second separation space w2 may include a second width. The first separation space w1 may have a width smaller than that of the second separation space w2.

Figure 8B:
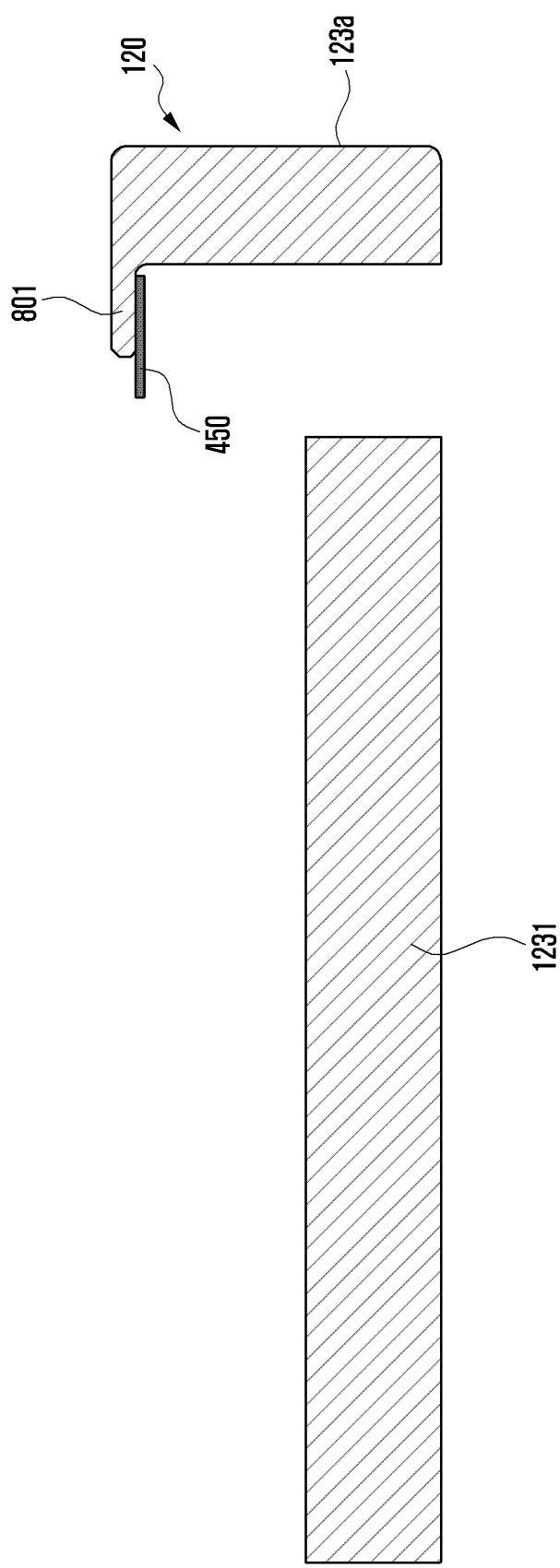

With reference to FIG. 8B, at a rear surface of the extension part 801 formed on the fourth side surface 123a of the second housing 120, a protection member 450 may be disposed extending to the first separation space w1. The protection member 450 may protect the bending part 820 of the display panel 804. The protective member 450 may include a cover layer or a coating member. The protective member 450 may include a material such as a polymer, plastic, silicon, or metal. The protection member 450 may include various other materials sufficient to offer some degree of protection to the bending part 820.

Figure 8C:
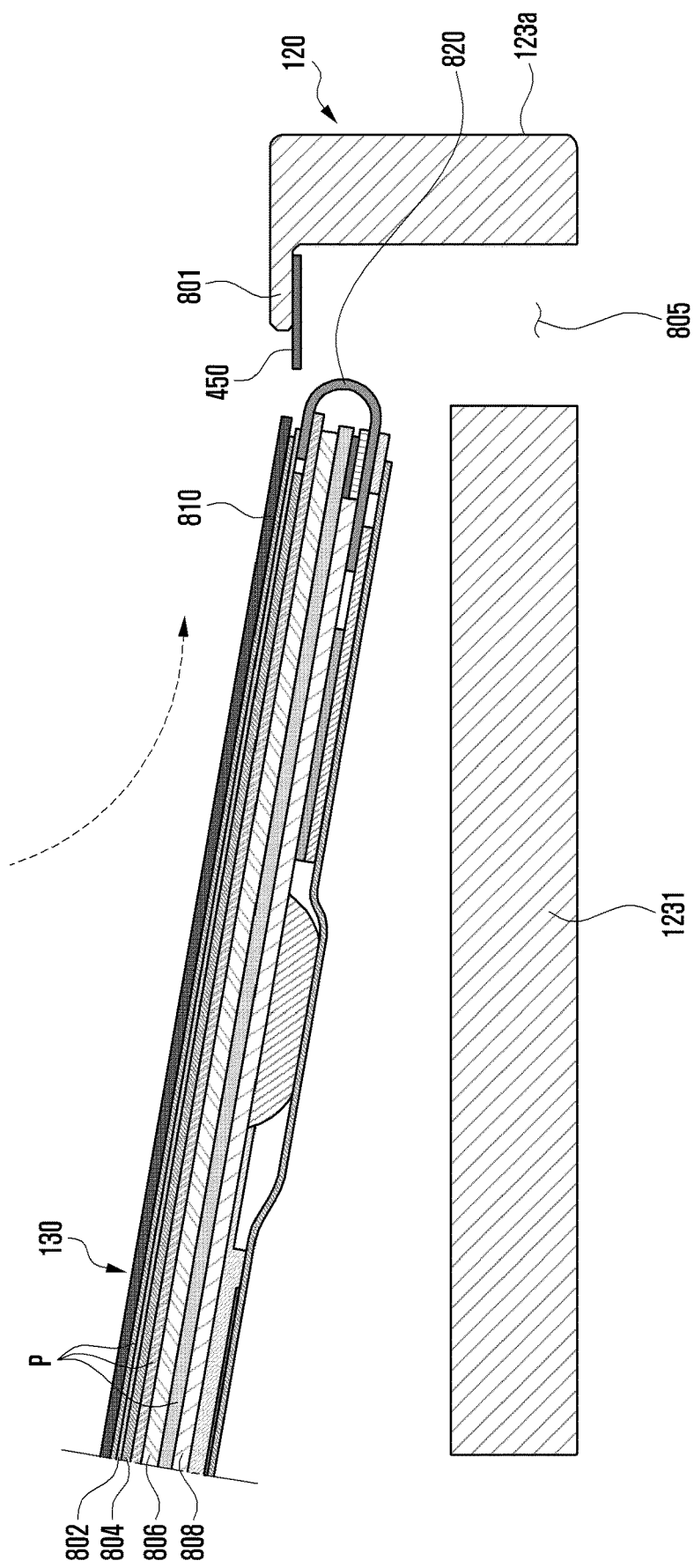
Figure 8D:
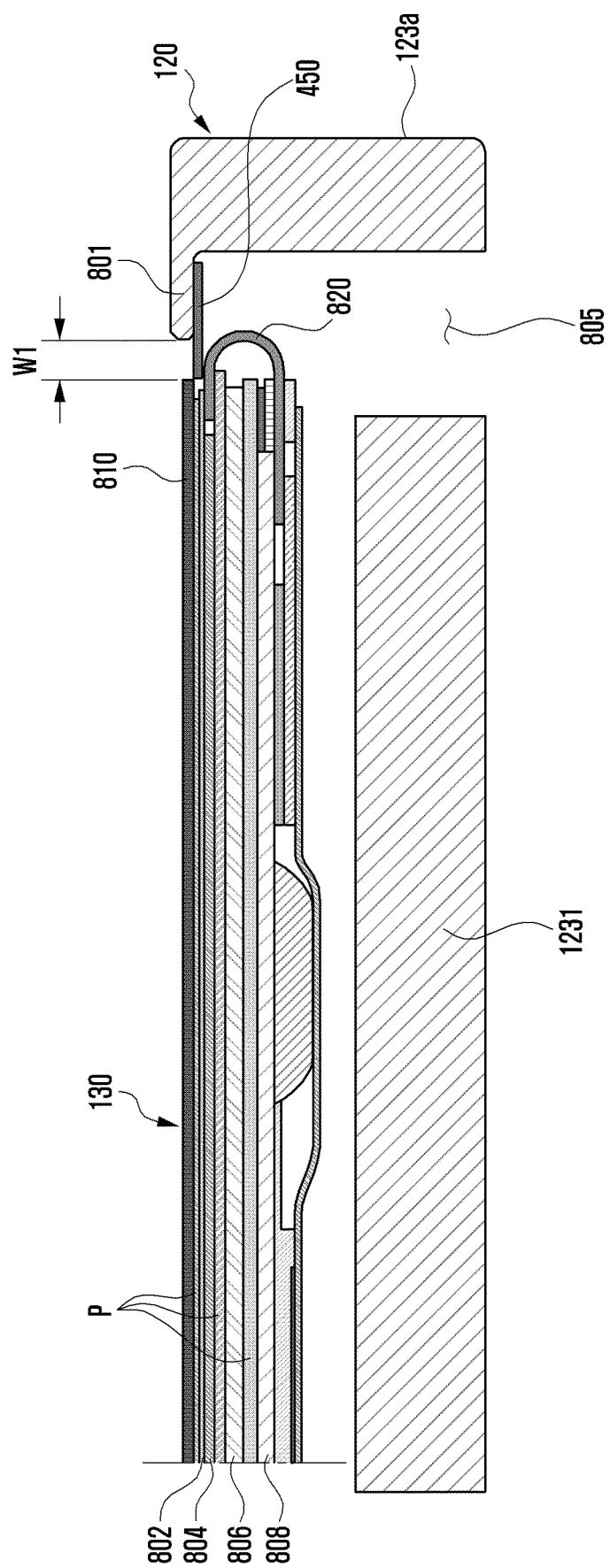

With reference to FIGS. 8C and 8D, the flexible display 130 may be disposed over the second support plate 1231 of the second housing 120. According to an embodiment, at least a portion of the bending part 820 of the flexible display 130 may be disposed under the protective member 450. The window 810 of the flexible display 130 may be disposed at a position substantially parallel to the extension part 801 of the second housing 120 at a separation distance equal to the first separation space w1.

With reference to FIG. 8E, the first sealing member 410 may be disposed in the first separation space w1 formed between the window 810 of the flexible display 130 and the extension part 801 of the second housing 120. The first sealing member 410 may be disposed on the protection member 450. In this case, the first sealing member 410 may not contact or intrude upon the bending part 820 of the display panel. The protection member 450 may thus protect the bending part 820 of the display panel from potential damage from the first sealing member 410.

FIGS. 9A to 9D are cross-sectional views illustrating certain embodiments of a portion e-e' of the electronic device illustrated in FIG. 4A. FIGS. 9A to 9D are cross-sectional views illustrating a state in which a bending part of a flexible display is disposed inside a window.

Figure 9A:
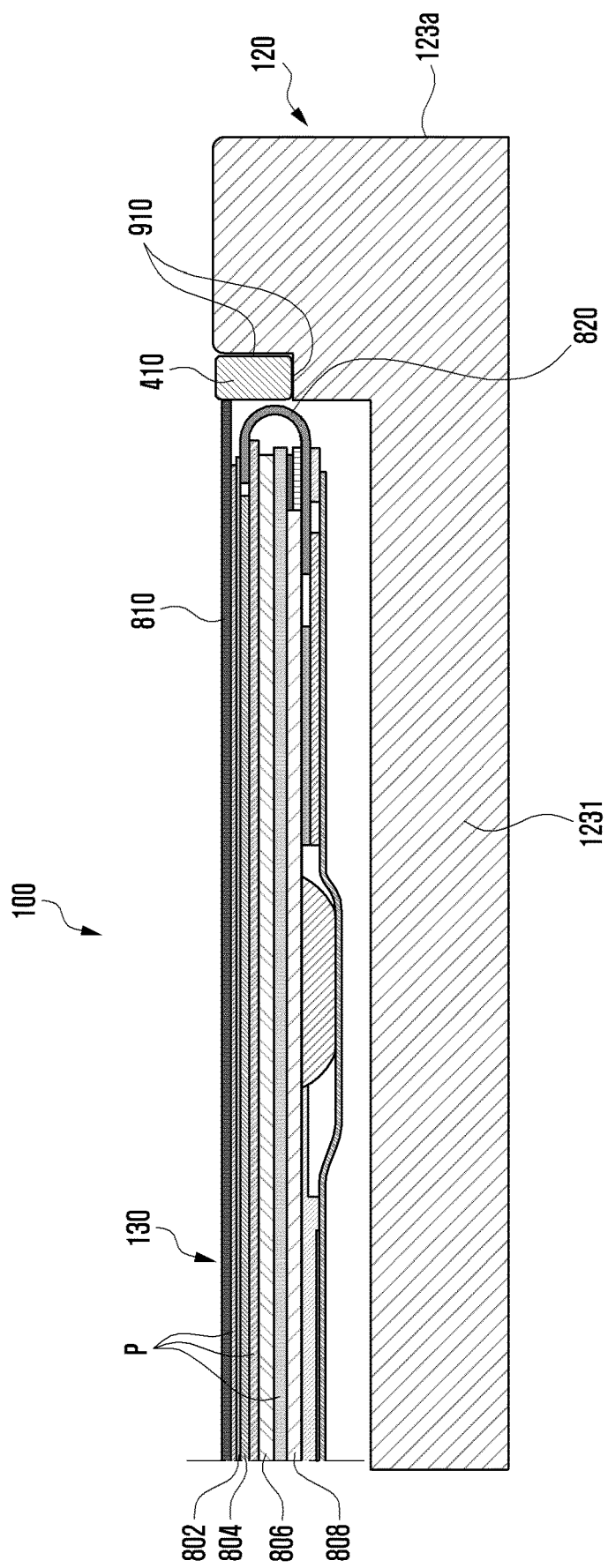
FIGS. 9A to 9D are cross-sectional views illustrating certain embodiments of a portion e-e' of the electronic device illustrated in FIG. 4A according to certain embodiments of the disclosure.

With reference to FIG. 9A, in the flexible display 130 of the electronic device 100 according to certain embodiments of the disclosure, the bending part 820 of the display panel 804 is not exposed to the outside of the window 810, but may be disposed inside the window 810.

According to an embodiment, at least a portion of an upper portion of the fourth side surface 123a of the second housing 120 may be cut, and a seating surface 910 may be formed. A first sealing member 410 may be disposed at the seating surface 910. The first sealing member 410 may be disposed between the window 810 and the seating surface 910 of the flexible display 130. The first sealing member 410 disposed at the seating surface 910 may not contact the bending part 820 of the display panel.

Figure 9B:
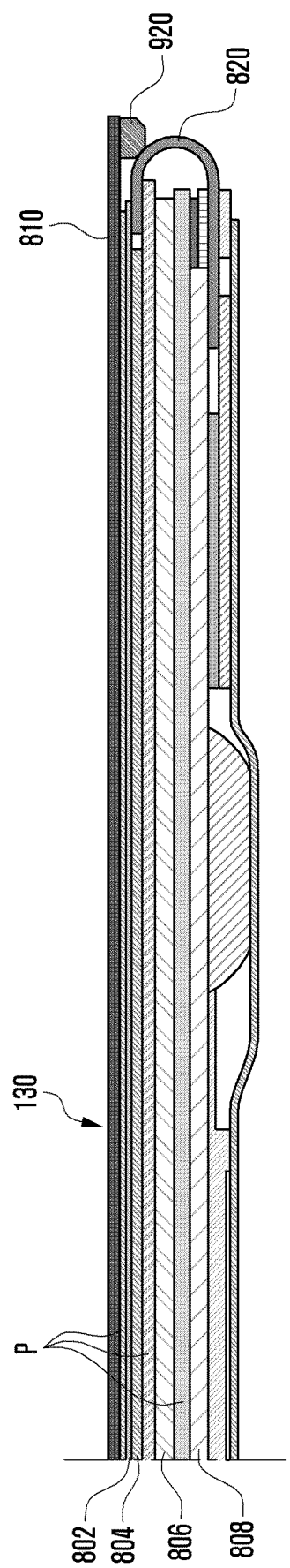

With reference to FIG. 9B, a coating member 920 may be disposed at a rear surface of a first end of the window 810 of the flexible display 130. The coating member 920 may be disposed between the first end of the window 810 and the bending part 820 of the display panel.

Figure 9C:
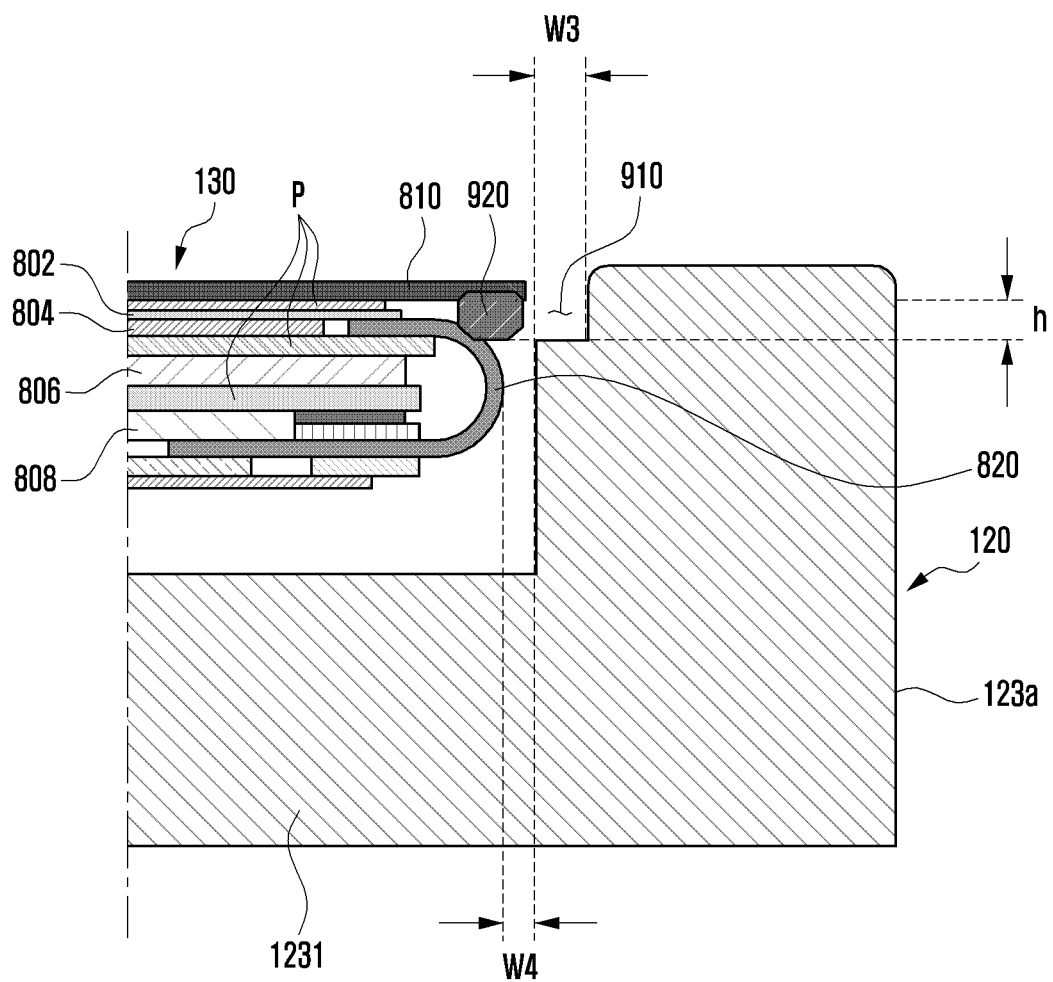

With reference to FIG. 9C, a third separation space "w3" may be formed between the window 810 of the flexible display 130 and the seating surface 910 formed at the fourth side surface 123a of the second housing 120. The first sealing member 410 may be disposed in the third separation space w3. A fourth separation space "w4" may be formed between the bending part 820 of the display panel and the fourth side surface 123a of the second housing 120. The fourth separation space w4 may prevent the bending part 820 of the display panel from contacting the inner surface of the fourth side surface 123a of the second housing 120. The seating surface 910 formed at the fourth side surface 123a of the second housing 120 may have a height "h" substantially corresponding to the thickness of the coating member 920.

Figure 9D:
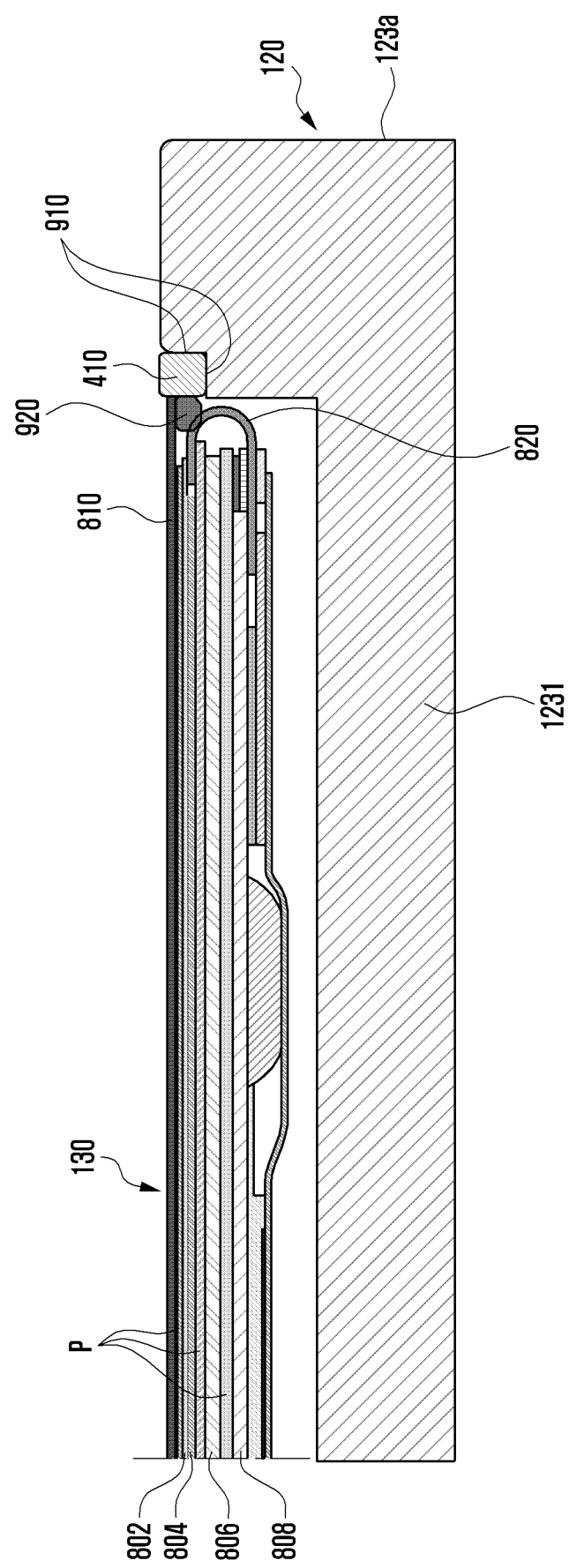

With reference to FIGS. 9C and 9D, the first sealing member 410 may be disposed at the third separation space w3 formed between the window 810 of the flexible display 130, and the seating surface 910 formed at the fourth side surface 123a of the second housing 120. In this case, the first sealing member 410 may not contact or intrude upon the bending part 820 of the display panel by the coating member 920 disposed at the rear surface of the first end of the window 810. The coating member 920 may protect the bending part 820 of the display panel from the first sealing member 410. The coating member 920 may be made of a material (e.g., silicone) having low surface adhesion.

FIG. 10 is a diagram illustrating deformation of a flexible display of an electronic device according to certain embodiments of the disclosure. FIG. 10A is a diagram schematically illustrating a portion of the flexible display in an unfolded state. FIG. 10B is a diagram schematically illustrating a portion of the flexible display in a folded state.

With reference to FIG. 10A, the flexible display 130 may include a window 810, a polarizer 802, a display panel 804, a polymer member 806, a metal sheet layer 808, and/or an adhesive P.

According to certain embodiments, a neutral area 1010 may be formed between the window 810 and the metal sheet layer 808. For example, an area in which the polarizer 802, the display panel 804, the polymer member 806, and/or the adhesive P are disposed may form the neutral area 1010 of the flexible display 130.

According to certain embodiments, in the flexible display 130, when the first housing 110 and the second housing 120 are disposed in an unfolded state, a movement of the adhesive P disposed between the window 810, the polarizer 802, the display panel 804, the polymer member 806, and/or the metal sheet layer 808 may be relatively small. In the flexible display 130, when the first housing 110 and the second housing 120 are in an unfolded state and the adhesive P has a relatively small degree of movement, less deformation may occur in the neutral area 1010 formed through the polarizer 802, the display panel 804, the polymer member 806, and/or the adhesive P.

According to certain embodiments, referring to FIG. 10B, in the flexible display 130, when the first housing 110 and the second housing 120 are switched from the unfolded state to the folded state, a greater degree of movement and slip may occur in the adhesive P disposed between the window 810, the polarizer 802, the display panel 804, the polymer member 806, and/or the metal sheet layer 808. In the flexible display 130, when the first housing 110 and the second housing 120 are in a folded state and the adhesive P is subject to a larger movement, more deformations may occur in the neutral area 1010 formed through the polarizer 802, the display panel 804, the polymer member 806, and/or the adhesive P. When deformation occurs in the neutral area 1010, the flexible display 130 may, for example, slip around the folding axis A of FIG. 4A.

Figure 11A:
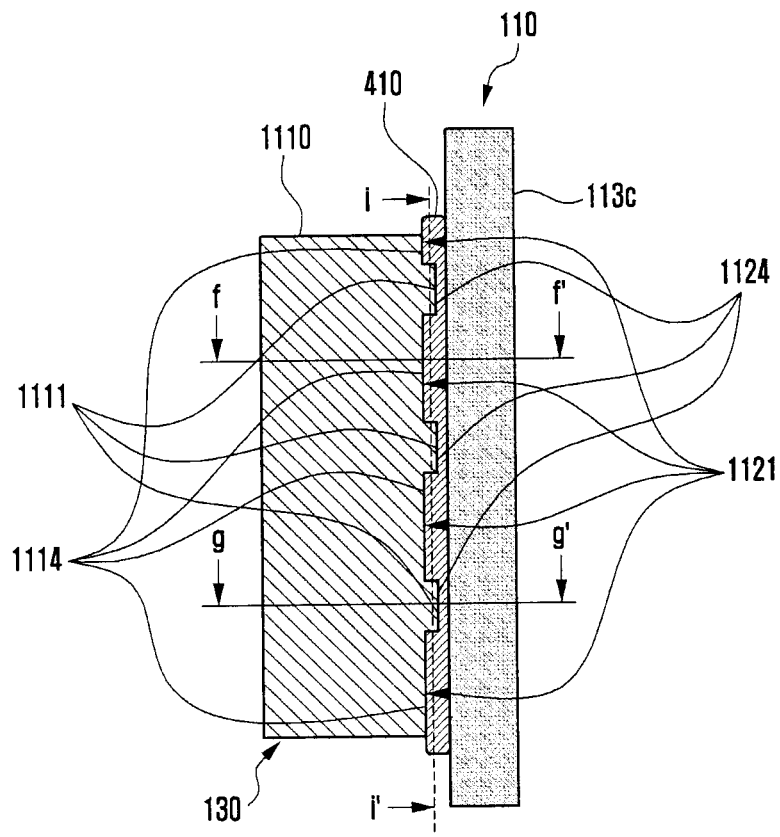
FIG. 11A is a diagram illustrating an engagement structure of a support plate and a first sealing member of a flexible display according to certain embodiments of the disclosure.
Figure 11B:
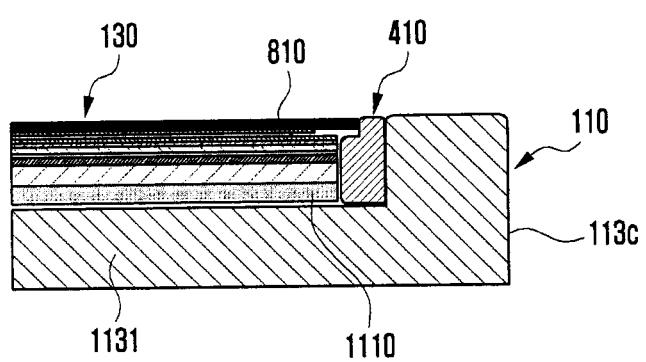
FIG. 11B is a cross-sectional view illustrating a portion f-f of FIG. 11A according to certain embodiments of the disclosure.
Figure 11C:
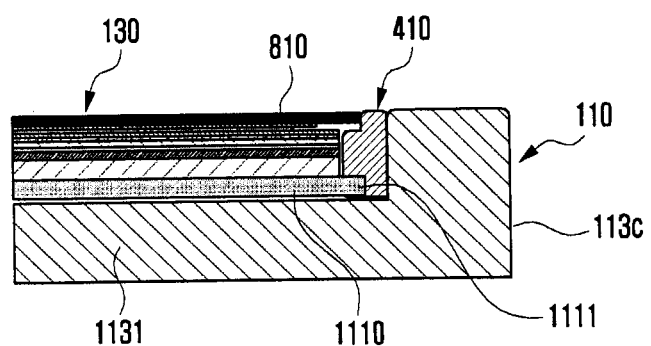
FIG. 11C is a cross-sectional view illustrating a portion g-g' of FIG. 11A according to certain embodiments of the disclosure.
Figure 12:
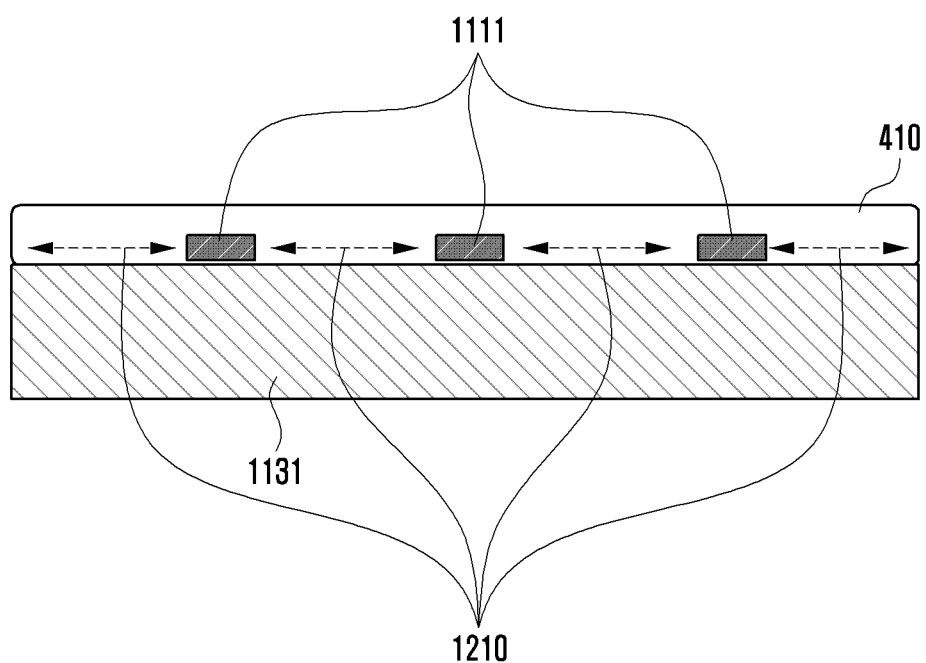
FIG. 12 is a cross-sectional view illustrating a portion i-i' of FIG. 11A according to certain embodiments of the disclosure.

FIG. 11 is a diagram illustrating a coupling structure of a flexible display and a first sealing member of an electronic device according to certain embodiments of the disclosure. FIG. 11 is a cross-sectional view schematically illustrating an embodiment of a portion II' of FIG. 4A. FIG. 11A is a diagram illustrating an engagement structure of a support plate and a first sealing member of a flexible display. FIG. 11B is a cross-sectional view illustrating a portion f-f of FIG. 11A. FIG. 11C is a cross-sectional view illustrating a portion g-g' of FIG. 11A. FIG. 12 is a cross-sectional view illustrating a portion i-i' of FIG. 11A.

According to certain embodiments, FIG. 11A illustrates a cross-section (e.g., the portion I-I' of FIG. 4A) of a portion of the third side surface 113c of the first housing 110 of the electronic device 100 illustrated in FIG. 4A.

With reference to FIG. 11A, a support plate 1110, which is a partial configuration of the flexible display 130 may include at least one convex part 1111 and at least one concave part 1114. The support plate 1110 of the flexible display 130 may form an uneven structure using at least one convex part 1111 and at least one concave part 1114. According to an embodiment, the support plate 1110 may include the metal sheet layer 808 of FIG. 8A.

According to an embodiment, the first sealing member 410 may be disposed between the inner surface of the third side surface 113c of the first housing 110 and the outer surface of the flexible display 130. The first sealing member 410 may include at least one convex part 1121 and at least one concave part 1124. The first sealing member 410 may form an uneven structure using at least one convex part 1121 and at least one concave part 1124.

According to an embodiment, at least one convex part 1111 formed in the support plate 1110 of the flexible display 130 may be engaged with at least one concave part 1124 formed in the first sealing member 410. At least one convex part 1121 formed in the first sealing member 410 may be engaged with at least one concave part 1114 formed in the support plate 1110. At least one convex part 1111 and at least one concave part 1114 formed in the support plate 1110, and at least one convex part 1121 and at least one concave part 1124 formed in the first sealing member 410 may form an engagement structure. In this case, the device can accommodate for deformations and/or stress generated between the flexible display 130 and the first sealing member 410 according to an operation of the first housing 110 and the second housing 120 in the unfolded and folded state.

According to certain embodiments, when at least one convex part 1111 and at least one concave part 1114 formed in the support plate 1110, and at least one convex part 1121 and the at least one concave part 1124 formed in the first sealing member 410 are coupled to have an engagement structure, there may be formed a structure that provides rigidity so as not to prevent separation thereof when slip occurs between the flexible display 130 and the first sealing member 410 according to the operation of the first housing 110 and the second housing 120 in an unfolded and folded state.

FIG. 11B is a cross-sectional view illustrating a portion f-f' of FIG. 11A and illustrates a formed state of an engagement structure of at least one convex part 1121 formed in the first sealing member 410 and at least one concave part 1114 formed in the support plate 1110 of the flexible display 130.

According to certain embodiments, when at least one concave part 1114 formed in the support plate 1110 and at least one convex part 1121 formed in the first sealing member 410 are coupled to form an engaging structure, a rigid coupling structure may be formed, compared to a case in which at least one concave part 1114 and at least one convex part 1121 are coupled in a state in which at least one concave part 1114 and at least one convex part 1121 are not formed in the support plate 1110 and the first sealing member 410, respectively.

FIG. 11C is a cross-sectional view illustrating a portion g-g' of FIG. 11A and illustrates a formed state of an engaging structure of at least one concave part 1124 formed in the first sealing member 410 and at least one convex part 1111 formed in the support plate 1110 of the flexible display 130.

According to certain embodiments, when at least one convex part 1111 formed in the support plate 1110 and at least one concave part 1124 formed in the first sealing member 410 are coupled to form an engaging structure, a rigid coupling structure may be formed, compared to a case in which at least one convex part 1111 and at least one concave part 1124 are coupled in a state in which at least one convex part 1111 and at least one concave part 1124 are not formed in the support plate 1110 and the first sealing member 410, respectively.

FIG. 12 is a cross-sectional view illustrating a portion i-i' of FIG. 11A and illustrates a state in which the support plate 1110 of the flexible display 130 forms an engaging structure (e.g., woven structure) with the first sealing member 410 using at least one convex part 1111.

With reference to FIG. 12, at least one deformation preventing structure 1210 is formed between the convex parts 1111 formed in the support plate 1110, so that during unfolding and folding operations of the first housing 110 and the second housing 120, slip between the flexible display 130 and the first sealing member 410 may be reduced. When the slip generated between the flexible display 130 and the first sealing member 410 is reduced, the waterproof and/or dustproof performance between the flexible display 130 and the first sealing member 410 may be improved.

According to certain embodiments, in the electronic device 100 according to certain embodiments of the disclosure, as the first housing 110 and the second housing 120 repeat a folded state and/or an unfolded state, slip and/or movement that may occur between the flexible display 130 and the first sealing member 410 may be reduced.

FIG. 13A is a plan view schematically illustrating the inside of an electronic device before a flexible display is mounted in the electronic device according to certain embodiments of the disclosure. FIG. 13B is an enlarged view illustrating an embodiment of a portion b illustrated in FIG. 13A. FIG. 13C is an enlarged view illustrating a portion c illustrated in FIG. 13A.

According to certain embodiments, FIG. 13B illustrates a portion of the first side surface 113a of the first housing 110 of the electronic device 100 illustrated in FIG. 13A. FIG. 13C illustrates a portion of a sixth side surface 123c of the second housing of the electronic device 100 illustrated in FIG. 13A.

With reference to FIGS. 13A to 13C, the receiver plate 460 may be disposed inside the first side surface 113a of the first housing 110. The receiver plate 460 may mount the receiver 101 (e.g., speaker) of FIG. 1A. At least a portion of the first sealing member 410 may be disposed in the receiver plate 460.

According to an embodiment, the second sealing member 430 may be disposed in at least a portion of the first housing 110 and perform a waterproof and/or dustproof function. The second sealing member 430 may be disposed in a portion of the second side surface 113b of the first housing 110 and extend from a portion of the second side surface 113b to be disposed in a portion of the third side surface 113c. The second sealing member 430 may be, for example, disposed closer to the hinge module 140 than the first side surface 113a of the first housing 110. The third sealing member 440 may be disposed in at least a portion inside the second housing 120 and perform a waterproof and/or dustproof function. The third sealing member 440 may be disposed in a portion of the fifth side surface 123b of the second housing 120 and be extended from a portion of the fifth side surface 123b to be disposed in a portion of the sixth side surface 123c. The third sealing member 440 may be, for example, disposed closer to the hinge module 140 than the fourth side surface 123a of the second housing 120.

According to certain embodiments, each side surface of the second sealing member 430 and/or the third sealing member 440 may include at least one groove 1310. The at least one groove 1310 may be engaged with the at least one convex part 1121 formed in the first sealing member 410.

According to certain embodiments, when at least one groove 1310 formed in the side surface of the second sealing member 430 and/or the third sealing member 440, respectively, and at least one convex part 1121 formed in the first sealing member 410 are coupled so as to have an engaging structure, it is possible to provide a rigid structure that reduces deviation with respect to slip and/or movement that may occur according to the operation of the unfolded and folded state of the first housing 110 and the second housing 120.

Figure 15:
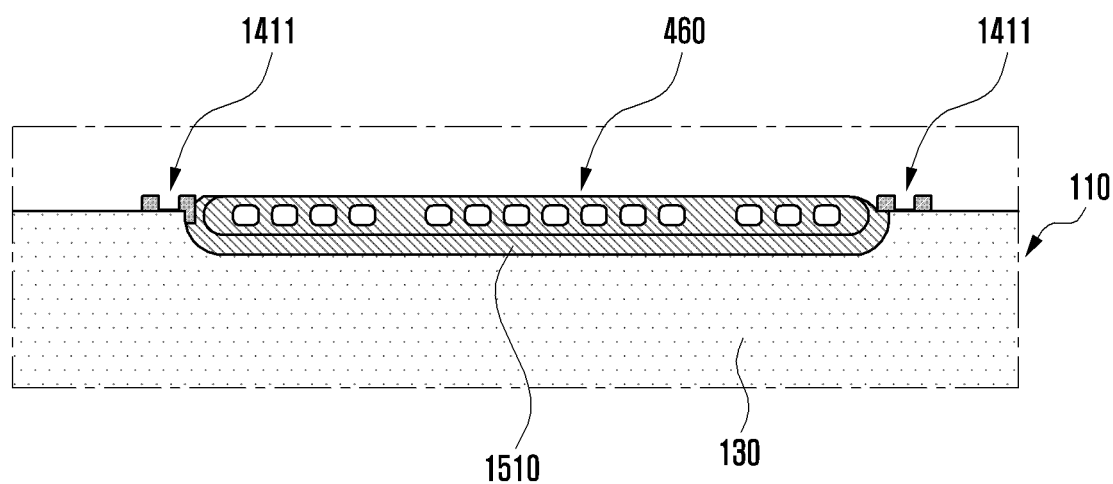
FIG. 15 is a diagram illustrating a portion of a state in which a flexible display is mounted in the receiver plate of FIG. 14 according to certain embodiments of the disclosure.
Figure 16:
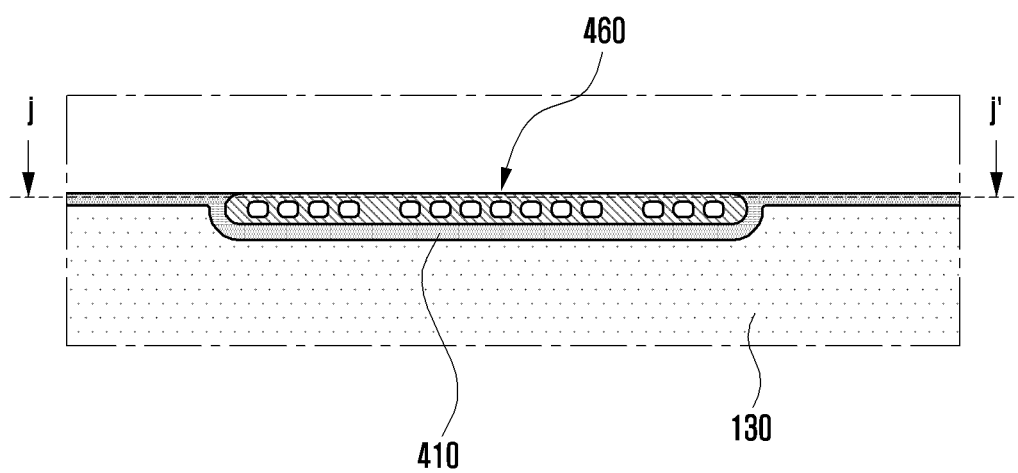
FIG. 16 is a diagram illustrating a portion of a state in which a first sealing member is disposed in an upper portion of a fourth sealing member according to certain embodiments of the disclosure.
Figure 17:
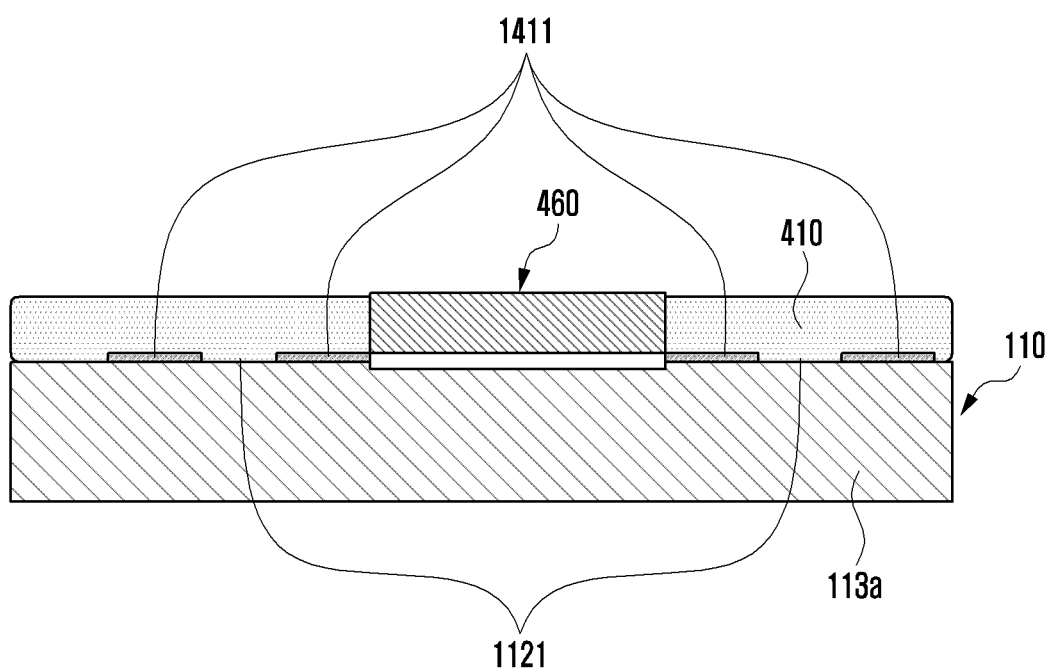
FIG. 17 is a cross-sectional view illustrating a portion j-j' of FIG. 16 according to certain embodiments of the disclosure.

FIG. 14 is a diagram illustrating a state in which a fourth sealing member is attached to a receiver plate of an electronic device according to certain embodiments of the disclosure. FIG. 14A is a diagram illustrating a front surface of a receiver plate. FIG. 14B is a diagram illustrating a rear surface of a receiver plate. FIG. 15 is a diagram illustrating a portion of a state in which a flexible display is mounted in the receiver plate of FIG. 14. FIG. 16 is a diagram illustrating a portion of a state in which a first sealing member is disposed in an upper portion of a fourth sealing member. FIG. 17 is a cross-sectional view illustrating a portion j-j' of FIG. 16.

With reference to FIGS. 14A and 14B, a fourth sealing member 1410 may be disposed at least partially at a rear surface of the receiver plate 460. The upper portion of the fourth sealing member 1410 may include at least one uneven part 1411.

According to certain embodiments, the receiver plate 460 may be disposed inside the first side surface 113a of the first housing 110. The receiver plate 460 may mount the receiver 101 (e.g., speaker) of FIG. 1A.

With reference to FIG. 15, when the flexible display 130 is disposed on the first housing 110 and/or the second housing 120, the uneven part 1411 formed on the fourth sealing member 1410 may protrude towards the outside of the upper surface of the flexible display 130. According to an embodiment, the receiver plate 460 may include a slit 1510 formed across a specified direction (e.g., horizontal direction).

With reference to FIGS. 16 and 17, the first sealing member 410 may be disposed in the slit 1510 formed in the receiver plate 460. The first sealing member 410 may be coupled to the uneven part 1411 of the fourth sealing member 1410. The first sealing member 410 may be coupled to form an engaging structure with the uneven part 1411 of the fourth sealing member 1410 using at least one convex part 1121. When the at least one convex part 1121 formed in the first sealing member 410 and the uneven part 1411 formed in the fourth sealing member 1410 are coupled to have an engaging structure, it is possible to provide a rigid structure that prevents separation from each other with respect to slip and/or movement that may be generated according to an operation in the unfolded and folded state of the first housing 110 and the second housing 120.

Figure 18:
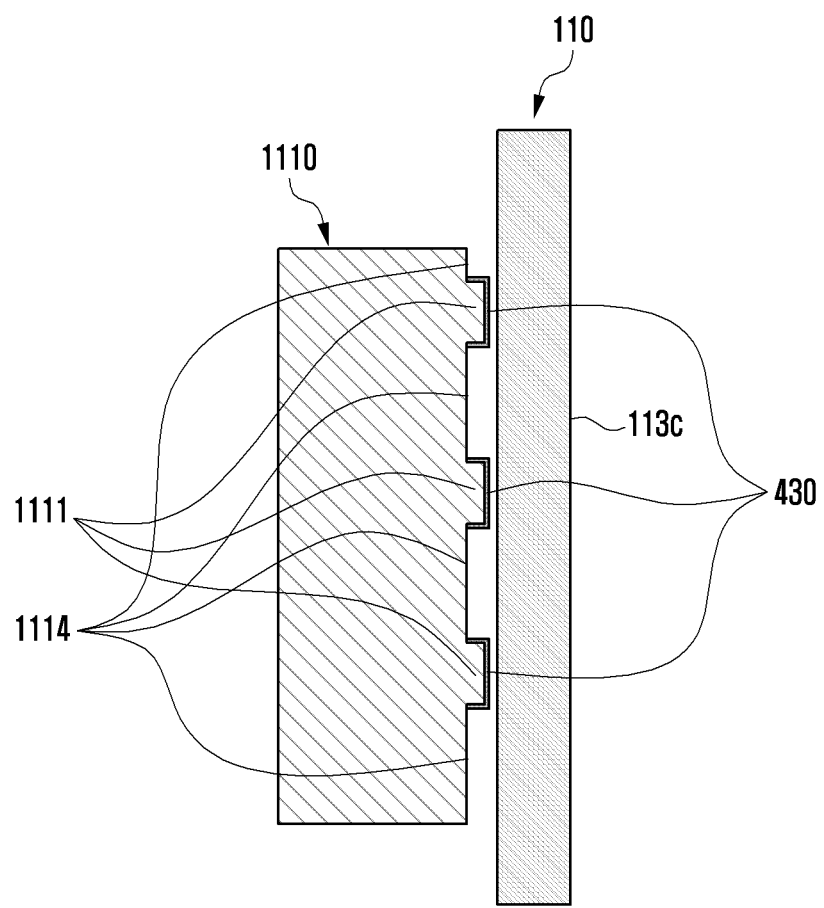
FIG. 18 is a diagram illustrating a configuration in which a second sealing member is disposed between a flexible display and a first sealing member of an electronic device according to certain embodiments of the disclosure.

FIG. 18 is a diagram illustrating a configuration in which a second sealing member is disposed between a flexible display and a first sealing member of an electronic device according to certain embodiments of the disclosure. FIG. 18 is a diagram schematically illustrating a portion c or a portion d in a state in which the flexible display is mounted in FIG. 13.

Figure 19A:
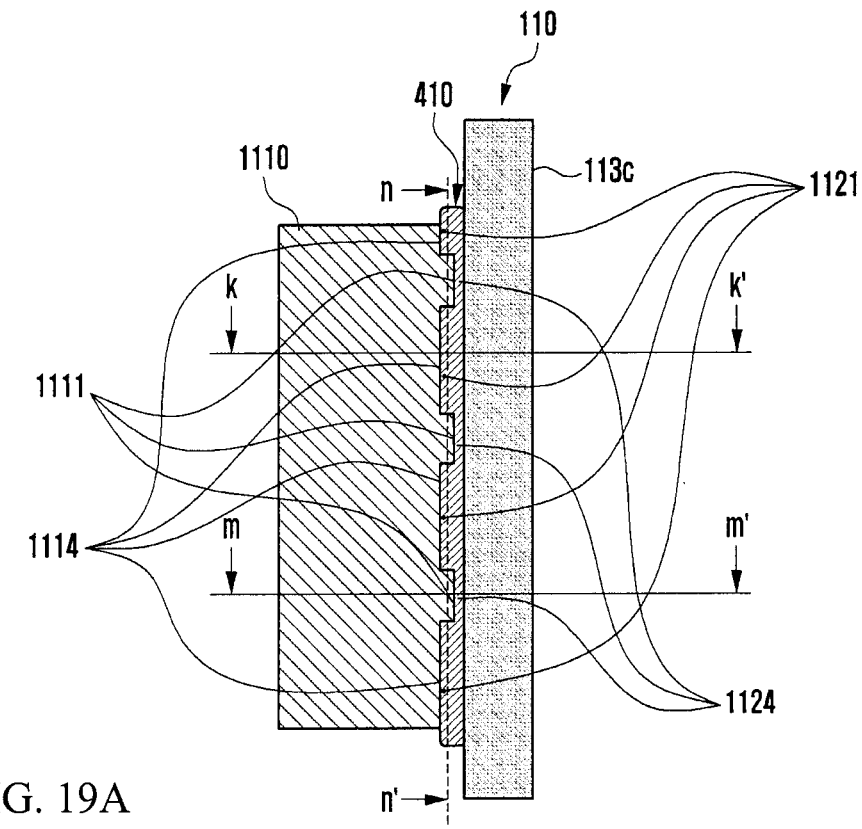
FIG. 19A is a diagram illustrating an engagement structure of a support plate, a second sealing member, and a first sealing member of a flexible display according to certain embodiments of the disclosure.
Figure 19B:
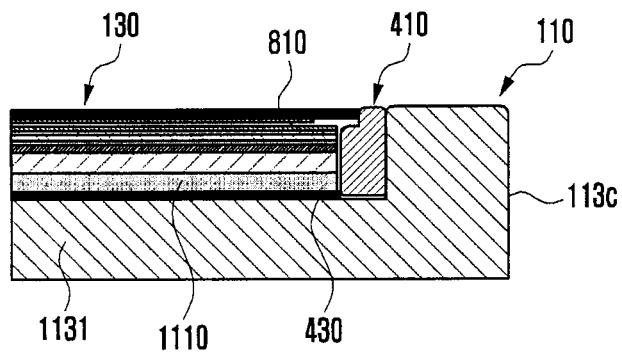
FIG. 19B is a cross-sectional view illustrating a portion k-k' of FIG. 19A according to certain embodiments of the disclosure.
Figure 19C:
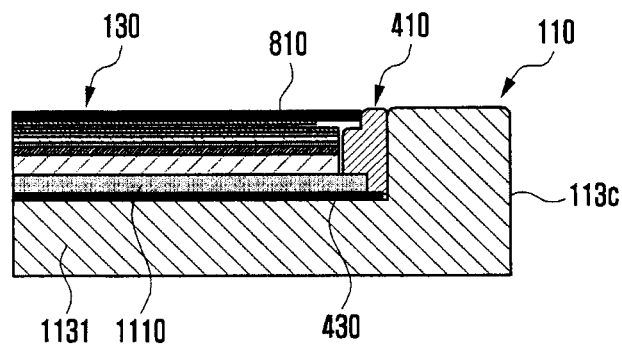
FIG. 19C is a cross-sectional view illustrating a portion m-m' of FIG. 19A according to certain embodiments of the disclosure.
Figure 20:
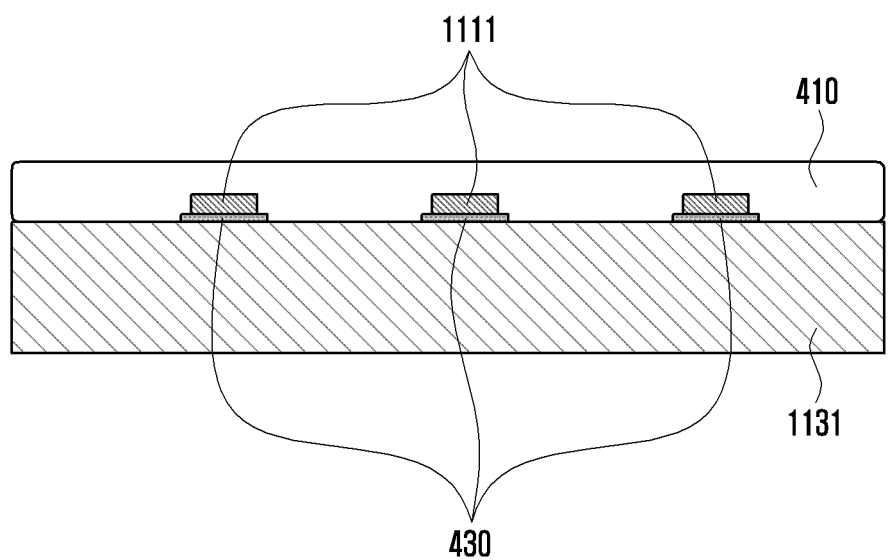
FIG. 20 is a cross-sectional view illustrating a portion n-n' of FIG. 19A according to certain embodiments of the disclosure.

FIG. 19 is a diagram schematically illustrating certain embodiments of a portion I-I' of FIG. 4A. FIG. 19A is a diagram illustrating an engagement structure of a support plate, a second sealing member, and a first sealing member of a flexible display. FIG. 19B is a cross-sectional view illustrating a portion k-k' of FIG. 19A. FIG. 19C is a cross-sectional view illustrating a portion m-m' of FIG. 19A. FIG. 20 is a cross-sectional view illustrating a portion n-n' of FIG. 19A.

With reference to FIG. 18, the support plate 1110, which is a partial configuration of the flexible display 130, may include at least one convex part 1111 and at least one concave part 1114.

According to an embodiment, the second sealing member 430 may be disposed so as to be exposed to the exterior of the at least one convex part 1111 formed in the support plate 1110 of the flexible display 130. The second sealing member 430 may be disposed under the support plate 1110.

With reference to FIG. 19A, a first sealing member 410 may be disposed between the inner surface of the third side surface 113c of the first housing 110 and the support plate 1110 of the flexible display 130 and the second sealing member 430.

According to an embodiment, at least one convex part 1111 formed in the support plate 1110 of the flexible display 130 and the second sealing member 430 disposed outside the convex part 1111 may be engaged with at least one first concave part 1124 formed in the sealing member 410. At least one convex part 1121 formed in the first sealing member 410 may be engaged with at least one concave part 1114 formed in the support plate 1110.

With reference to FIG. 19B, when at least one concave part 1114 formed in the support plate 1110 of the flexible display 130 and at least one convex part 1121 formed in the first sealing member 410 form an engagement structure, the second sealing member 430 may have substantially the same end surface as that of the at least one concave part 1114 formed in the support plate 1110.

With reference to FIGS. 19C and 20, when an engaging structure is formed by at least one convex part 1111 formed in the support plate 1110 of the flexible display 130, the sealing member 430 exposed to the outside from a lower portion of the convex part 1111, and the at least one concave part 1124 formed in the first sealing member 410, the second sealing member 430 exposed to the exterior from the lower portion of the convex part 1111 may be disposed at a bottom surface of the first sealing member 410. In this case, the bottom surface of the first sealing member 410 may be disposed on the second sealing member 430. The support plate 1110 of the flexible display 130 may form an engaging structure (e.g., woven structure) with the first sealing member 410 using at least one convex part 1111 and at least a portion of the second sealing member 430. In this case, at least one deformation preventing structure (e.g., the deformation preventing structure 1210 of FIG. 12) may be formed between the convex parts 1111 formed in the support plate 1110.

An electronic device 100 according to certain embodiments of the disclosure includes a hinge module 140; a first housing 110 to which a first side of the hinge module 140 and at least a portion of a first support plate 1131 are coupled and including a first side surface 113a, a second side surface 113b, and a third side surface 113c; a second housing 120 to which a second side of the hinge module 140 and at least a portion of the second support plate 1231 are coupled, including a fourth side surface 123a, a fifth side surface 123b, and a sixth side surface 123c, and configured to be folded and unfolded with the first housing 110 based on a folding axis A of the hinge module 140; a flexible display 130 supported on the first housing 110 and the second housing 120 and configured to be folded and unfolded; a first sealing member 410 disposed to be integrally extended between an inner surface of the first housing 110, an inner surface of the second housing 120, and an outer surface of the flexible display; and an elastic support member disposed between a portion of the flexible display 130, a portion of the inner surface of the first housing 110, and a portion of the inner surface of the second housing 120 in a folding area in which the first housing 110 and the second housing 120 are folded and unfolded.

According to certain embodiments, the electronic device 100 may further include a second sealing member 430 disposed in at least a portion of the second side surface 113b of the first housing 110 and extended from at least a portion of the second side surface 113b to be disposed in at least a portion of the third side surface 113c of the first housing 110.

According to certain embodiments, the electronic device 100 may further include a third sealing member disposed in at least a portion of the fifth side surface 123b of the second housing 120 and extended from at least a portion of the fifth side surface 123b to be disposed in at least a portion of the sixth side surface 123c of the second housing 120.

According to certain embodiments, the electronic device 100 may further include a protection member 450 disposed inside the fourth side surface 123a of the second housing 120 to protect at least a portion of the flexible display 130.

According to certain embodiments, the electronic device 100 may further include a hinge housing 141 constituted to cover the hinge module, such that the elastic support member 420 may include a support part 421 disposed at a support surface formed in an upper portion of one side and the other side of the hinge housing 141; a rib 423 protruded upward from a side surface of an intermediate point of the support part; and a fastening protrusion 425 formed at one end and the other end of a rear surface of the support part and coupled to at least one fastening hole 510 formed at a specified position of the first support plate of the first housing 110 and the second support plate of the second housing 120.

According to certain embodiments, the first sealing member 410 may be disposed between the outer surface of the flexible display 130, the support part of the elastic support member 420 and the rib.

According to certain embodiments, the hinge housing 141 may include a cutting area formed inside one end and the other end, a dustproof member 610 may be disposed in the cutting area, and the dustproof member 610 may be disposed under the support part of the elastic support member 420.

According to certain embodiments, when the bending part 820 of the flexible display 130 is configured to be exposed to the outside of the window 810, the fourth side surface 123a of the second housing 120 may include an extension part 801 integrally extended from the upper portion, a first separation space w1 may be formed between the window 810 and the extension part 801 of the flexible display 130, an opening 805 may be formed between the fourth side surface 123a of the second housing 120 and the second support plate, and a second separation space w2 may be configured to be formed between the fourth side surface 123a of the second housing 120 and the bending part 820 of the display panel.

According to certain embodiments, in the electronic device 100, when the bending part 820 of the flexible display 130 is disposed inside the window 810, a seating surface 910 cut at least partially may be formed at the fourth side surface 123a of the second housing 120, the first sealing member 410 may be disposed at the seating surface 910, a coating member 920 may be disposed at a rear surface of a first end of the window 810, the coating member 920 may be disposed between the first end of the window 810, the bending part 820, and the first sealing member 410, and the first sealing member 410 may be configured not to contact the bending part 820.

According to certain embodiments, the flexible display 130 may include a support plate 1110, the support plate may include at least one convex part 1111 and at least one concave part 1114, the first sealing member 410 may be disposed between an inner surface of the third side surface 113c of the first housing 110 and an outer surface of the flexible display 130, the first sealing member 410 may include at least one convex part 1121 and at least one concave part 1124, at least one convex part 1111 formed in the support plate 1110 may be engaged with at least one concave part 1124 formed in the first sealing member, and at least one concave part 1114 formed in the support plate 1110 may be configured to engage with at least one convex part 1121 formed in the first sealing member 410.

According to certain embodiments, the second sealing member 430 and/or the third sealing member 440 may include at least one groove 1310 at a side surface, and the at least one groove 1310 may be configured to engage with at least one convex part 1121 formed in the first sealing member 410.

According to certain embodiments, the electronic device may further include a receiver plate 460 disposed inside the first side surface 113a of the first housing 110, such that a fourth sealing member 1410 may be disposed at least partially at the rear surface of the receiver plate 460, an upper portion of the fourth sealing member may include at least one uneven part 1411, and the first sealing member 410 may be coupled to form an engaging structure with the at least one uneven part 1411 formed in the fourth sealing member 1410 using at least one convex part 1121.

An electronic device 100 according to certain embodiments of the disclosure may include a hinge module 140; a first housing 110 to which a first side of the hinge module 140 and at least a portion of a first support plate 1131 are coupled and including a first side surface 113a, a second side surface 113b, and a third side surface 113c; a second housing 120 to which a second side of the hinge module 140 and at least a portion of the second support plate 1231 are coupled, including a fourth side surface 123a, a fifth side surface 123b, and a sixth side surface 123c, and configured to be folded and unfolded with the first housing 110 based on a folding axis A of the hinge module 140; a flexible display 130 supported on the first housing 110 and the second housing 120 and configured to be folded and unfolded; and a first sealing member 410 disposed to be integrally extended between an inner surface of the first housing 110, an inner surface of the second housing 120, and an outer surface of the flexible display 130.

According to certain embodiments, the electronic device 100 may further include an elastic support member 420 disposed between a portion of the flexible display 130, a portion of the inner surface of the first housing 110, and a portion of the inner surface of the second housing 120 in a folding area in which the first housing 110 and the second housing 120 are folded and unfolded.

According to certain embodiments, the electronic device 100 may further include a second sealing member 430 disposed in at least a portion of the second side surface 113b of the first housing 110 and extended from at least a portion of the second side surface 113b to be disposed in at least a portion of the third side surface 113c of the first housing 110.

According to certain embodiments, the electronic device 100 may further include a third sealing member 440 disposed in at least a portion of the fifth side surface 123b of the second housing 120 and extended from at least a portion of the fifth side surface 123b to be disposed in at least a portion of the sixth side surface 123c of the second housing 120.

According to certain embodiments, the electronic device 100 may further include a protection member 450 disposed inside the fourth side surface 123a of the second housing 120 to protect at least a portion of the flexible display 130.

According to certain embodiments, the electronic device 100 may further include a hinge housing 141 configured to cover the hinge module 140, and the elastic support member 420 may include a support part 421 disposed at a support surface formed in an upper portion of one side and the other side of the hinge housing 141; a rib 423 protruded upward from a side surface of an intermediate point of the support part 421; and a fastening protrusion 425 formed at one end and the other end of a rear surface of the support part and coupled to at least one fastening hole formed at a specified position of the first support plate of the first housing 110 and the second support plate of the second housing 120.

According to certain embodiments, the flexible display 130 may include a support plate 1110, the support plate may include at least one convex part 1111 and at least one concave part 1114, and the first sealing member 410 may be disposed between the inner surface of the third side surface 113c of the first housing 110 and the outer surface of the flexible display 130, the first sealing member 410 may include at least one convex part 1121 and at least one concave part 1124, at least one convex part 1111 formed in the support plate may be engaged with at least one concave part 1124 formed in the first sealing member 410, and at least one concave part 1114 formed in the support plate 1110 may be configured to engage with at least one convex part 1121 formed in the first sealing member 410.

According to certain embodiments, the electronic device may further include a receiver plate 460 disposed inside the first side surface 113a of the first housing 110, such that a fourth sealing member 410 may be disposed at least partially at the rear surface of the receiver plate 460; an upper portion of the fourth sealing member 410 may include at least one uneven part 1411, and the first sealing member 410 may be coupled to form an engaging structure with the at least one uneven part 1411 formed in the fourth sealing member 1410 using at least one convex part 1121.

In the above description, the disclosure has been described according to certain embodiments of the disclosure, but changes and modifications made by those of ordinary skill in the art to which the disclosure pertains without departing from the technical scope of the disclosure also belong to the disclosure.

The invention claimed is:

1. An electronic device, comprising:
a hinge module;
a first housing to which a first side of the hinge module and at least a portion of a first support plate are coupled, the first housing including a first rear cover, a first side surface, a second side surface, and a third side surface;
a second housing to which a second side of the hinge module and at least a portion of a second support plate are coupled, the second housing including a second rear cover, a fourth side surface, a fifth side surface, and a sixth side surface, wherein the second housing is foldably coupled with the first housing about a folding axis defined by the hinge module;
a flexible display spanning at least a portion of the first housing and the second housing;
a first sealing member surrounding a periphery of the flexible display and making contact with an inner surface of the first housing and an inner surface of the second housing, and disposed between the first rear cover and the flexible display, between the hinge module and the flexible display, and between the second rear cover and the flexible display; and
an elastic support member disposed between a portion of the flexible display, a portion of the inner surface of the first housing, and a portion of the inner surface of the second housing, within a folding area in which the first housing and the second housing are folded or unfolded.

2. The electronic device of claim 1, further comprising a second sealing member disposed in at least a portion of the second side surface of the first housing, and extending from at least a portion of the second side surface into at least a portion of the third side surface of the first housing.

3. The electronic device of claim 1, further comprising a third sealing member disposed in at least a portion of the fifth side surface of the second housing, and extending from at least a portion of the fifth side surface into at least a portion of the sixth side surface of the second housing.

4. The electronic device of claim 1, further comprising a protection member disposed inside the fourth side surface of the second housing to protect at least a portion of the flexible display.

5. The electronic device of claim 1, further comprising a hinge housing configured to cover the hinge module,
wherein the elastic support member further comprises:
a support part disposed at a support surface formed in an upper portion of first and second sides of the hinge housing;
a rib protruding upwards from an intermediate position on a side surface of the support part; and
a fastening protrusion formed at first and second ends of a rear surface of the support part, and coupled to at least one fastening hole formed on both the first support plate of the first housing and the second support plate of the second housing.

6. The electronic device of claim 5, wherein the first sealing member is disposed between the periphery of the flexible display, the support part of the elastic support member, and the rib.

7. The electronic device of claim 6, wherein the hinge housing further comprises a cutting area formed inside a first and second end of the hinge housing,
wherein a dustproof member is disposed in the cutting area, and under the support part of the elastic support member.

8. The electronic device of claim 1, wherein:
a bending part of the flexible display is configured to be exposed through a window,
the fourth side surface of the second housing includes an extension part extending from an upper portion of the fourth side surface,
a first separation space is formed between the window and the extension part of the second housing,
an opening is formed between the fourth side surface of the second housing and the second support plate, and
a second separation space is formed between the fourth side surface of the second housing and the bending part of the flexible display.

9. The electronic device of claim 1, wherein:
a bending part of the flexible display is disposed inside a window,
a seating surface is at least partially formed at the fourth side surface of the second housing,
the first sealing member is disposed at the seating surface, a coating member is disposed at a rear surface of a first end of the window, between the first end of the window, the bending part of the flexible display, and the first sealing member, and the first sealing member is disposed spatially separate from the bending part.

10. The electronic device of claim 1, wherein:
the flexible display includes a third support plate,
the third support plate includes at least one convex part and at least one concave part,
the first sealing member is disposed between an inner surface of the third side surface of the first housing and the periphery of the flexible display,
the first sealing member includes at least one convex part and at least one concave part,
the at least one convex part of the third support plate is configured to engage with the at least one concave part of the first sealing member, and
the at least one concave part of the third support plate is configured to engage with the at least one convex part of the first sealing member.

11. The electronic device of claim 10, wherein a second sealing member and/or a third sealing member further includes at least one groove at a side surface thereof, and
wherein the at least one groove is configured to engage with the at least one convex part of the first sealing member.

12. The electronic device of claim 1, further comprising a receiver plate disposed within the first side surface of the first housing,
wherein a fourth sealing member is disposed at least partially at a rear surface of the receiver plate,
wherein an upper portion of the fourth sealing member includes at least one uneven part, and
wherein the first sealing member is coupled with the at least one uneven part formed in the fourth sealing member to form an engaging structure using at least one convex part of the first sealing member.

13. An electronic device, comprising:
a hinge module;
a first housing to which a first side of the hinge module and at least a portion of a first support plate are coupled, the first housing including a first rear cover, a first side surface, a second side surface, and a third side surface;
a second housing to which a second side of the hinge module and at least a portion of a second support plate are coupled, the second housing including a second rear cover, a fourth side surface, a fifth side surface, and a sixth side surface, wherein the second housing is foldably coupled with the first housing about a folding axis defined by the hinge module;
a flexible display spanning at least a portion of the first housing and the second housing; and
a first sealing member surrounding a periphery of the flexible display and making contact with an inner surface of the first housing and an inner surface of the second housing, and disposed between the first rear cover and the flexible display and between the second rear cover and the flexible display.

14. The electronic device of claim 13, further comprising an elastic support member disposed between a portion of the flexible display, a portion of the inner surface of the first housing, and a portion of the inner surface of the second housing in a folding area within which the first housing and the second housing are folded or unfolded.

15. The electronic device of claim 13, further comprising a second sealing member disposed in at least a portion of the second side surface of the first housing and extending from at least a portion of the second side surface into at least a portion of the third side surface of the first housing.

16. The electronic device of claim 13, further comprising a third sealing member disposed in at least a portion of the fifth side surface of the second housing and extending from at least a portion of the fifth side surface into at least a portion of the sixth side surface of the second housing.

17. The electronic device of claim 13, further comprising a protection member disposed within the fourth side surface of the second housing to protect at least a portion of the flexible display.

18. The electronic device of claim 14, further comprising a hinge housing configured to cover the hinge module,
wherein the elastic support member further comprises:
a support part disposed at a support surface formed in an upper portion first and second side of the hinge housing;
a rib protruding upwards from an intermediate position on a side surface of the support part; and
a fastening protrusion formed at first and second ends of a rear surface of the support part, and coupled to at least one fastening hole formed on both the first support plate of the first housing and the second support plate of the second housing.

19. The electronic device of claim 13, wherein:
the flexible display includes a third support plate,
the third support plate includes at least one convex part and at least one concave part;
the first sealing member is disposed between an inner surface of the third side surface of the first housing and the periphery of the flexible display;
the first sealing member includes at least one convex part and at least one concave part;
the at least one convex part of the third support plate is configured to engage with the at least one concave part of the first sealing member,
the at least one concave part of the third support plate is configured to engage with the at least one convex part of the first sealing member.

20. The electronic device of claim 13, further comprising a receiver plate disposed within the first side surface of the first housing,
wherein a fourth sealing member is disposed at least partially at a rear surface of the receiver plate,
wherein an upper portion of the fourth sealing member includes at least one uneven part, and
wherein the first sealing member is coupled with the at least one uneven part formed in the fourth sealing member to form an engaging structure using at least one convex part.

* * * * *